United States Patent
Chou et al.

(10) Patent No.: US 9,550,667 B1
(45) Date of Patent: Jan. 24, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Cheng San Chou, Hsin Chu (TW); Chin-Min Lin, Hsinchu (TW); Chen Hsiung Yang, Hsinchu (TW)

(73) Assignee: TAIWAN SEMICONDUCTOR MANUFACTRUING COMPANY LTD., Hsinchu (TW)

( * ) Notice: Subject to any disclaimer, the term of this patent is extended or adjusted under 35 U.S.C. 154(b) by 0 days.

(21) Appl. No.: 14/847,521

(22) Filed: Sep. 8, 2015

(51) Int. Cl.
H04R 23/00 (2006.01)
B81B 7/00 (2006.01)
B81C 1/00 (2006.01)
H01L 43/02 (2006.01)
H01L 43/08 (2006.01)
H01L 43/12 (2006.01)

(52) U.S. Cl.
CPC ........... *B81B 7/007* (2013.01); *B81C 1/00301* (2013.01); *H01L 43/02* (2013.01); *H01L 43/08* (2013.01); *H01L 43/12* (2013.01); *B81B 2201/0235* (2013.01); *B81B 2201/0242* (2013.01)

(58) Field of Classification Search
CPC ............... B81B 7/007; B81B 2207/096; B81B 2207/012; B81B 2201/0264; B81B 2207/015; B81B 2207/07; B81B 2207/092; B81B 7/0006; B81B 2201/02; B81B 2201/0242; B81B 2203/04; B81B 2207/053; B81B 2207/097; B81C 1/00269; B81C 1/0023; B81C 1/00238; B81C 2203/0792; B81C 2203/0118; B81C 2203/0109; B81C 3/001; B81C 1/00301; B81C 2203/031; H01L 2924/1461
See application file for complete search history.

(56) References Cited

U.S. PATENT DOCUMENTS

| | | | |
|---|---|---|---|
| 2010/0072626 A1* | 3/2010 | Theuss | B81C 1/00301 257/774 |
| 2012/0229133 A1* | 9/2012 | Zimmer | B82Y 25/00 324/252 |
| 2013/0193527 A1* | 8/2013 | Chu | H01L 21/76898 257/414 |
| 2013/0299928 A1* | 11/2013 | Classen | B81B 3/0075 257/417 |
| 2014/0015123 A1* | 1/2014 | Bowles | B81C 1/0023 257/737 |
| 2015/0160089 A1* | 6/2015 | Dawson | G01L 27/002 73/1.59 |

* cited by examiner

*Primary Examiner* — Khiem D Nguyen
(74) *Attorney, Agent, or Firm* — WPAT, P.C., Intellectual Property Attorneys; Anthony King

(57) ABSTRACT

A semiconductor structure includes a first substrate, a second substrate, a first sensing structure over the first substrate, and between the first substrate and the second substrate, a via extending through the second substrate, and a second sensing structure over the second substrate, and including an interconnect structure electrically connected with the via, and a sensing material at least partially covering the interconnect structure.

20 Claims, 38 Drawing Sheets

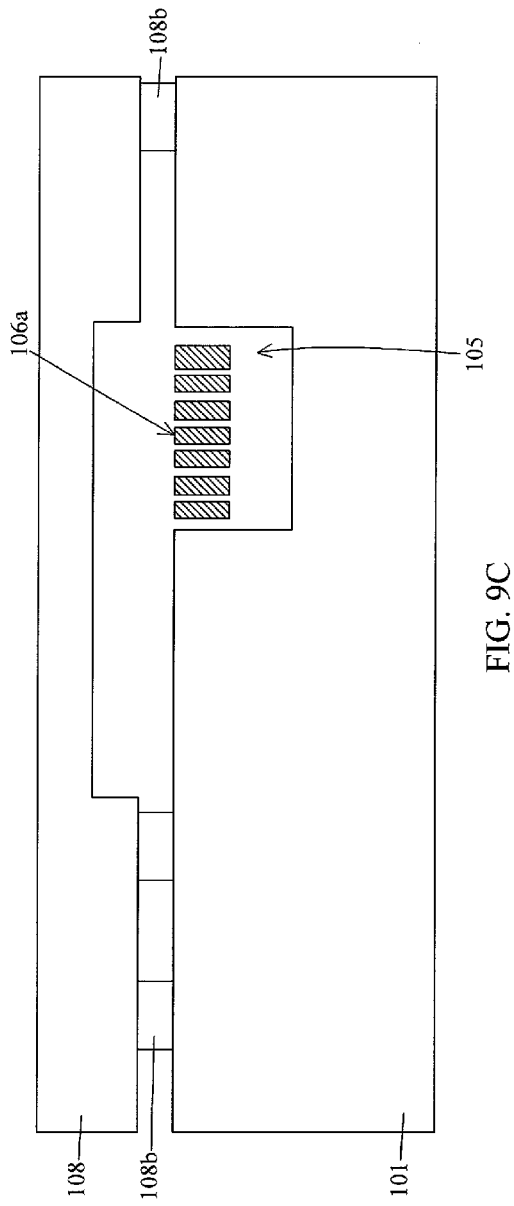
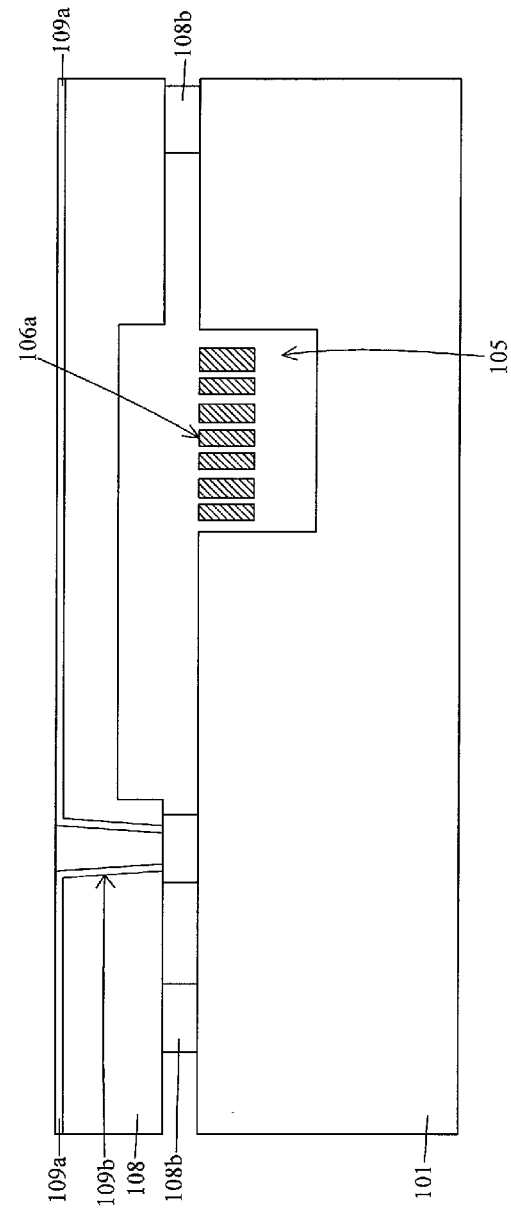
FIG. 9C
FIG. 9D

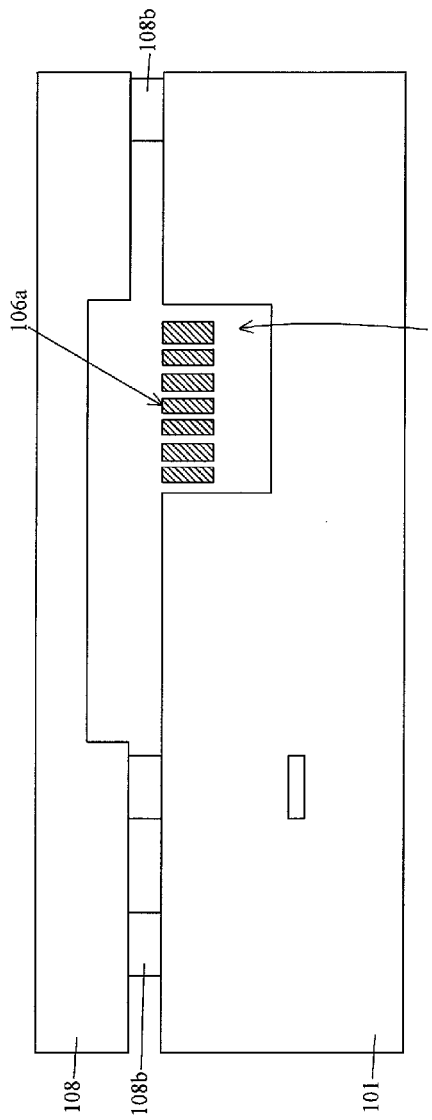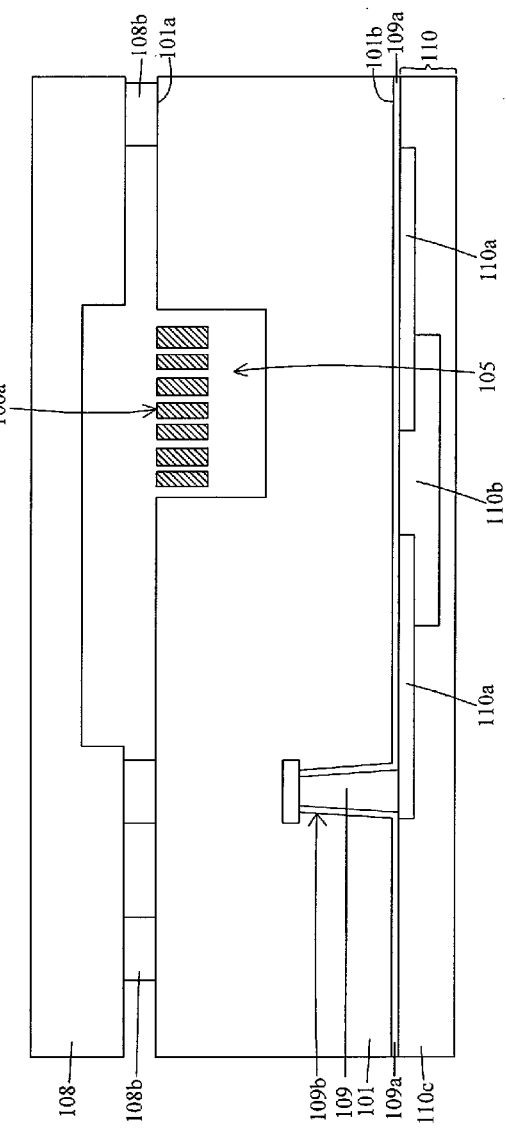

SEMICONDUCTOR STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. For many applications, MEMS device is electrically connected to external circuitry to form complete MEMS systems. Commonly, the connections are formed by wire bonding. MEMS devices are widely used in various applications. MEMS applications include motion sensor, gas detectors, pressure sensors, printer nozzles, or the like. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. Numerous manufacturing operations are implemented within such a small and high performance semiconductor device. The manufacturing of the semiconductor device in a miniaturized scale becomes more complicated. The increase in complexity of manufacturing may cause deficiencies such as high yield loss, poor reliability of the electrical interconnection, warpage, etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 9A-9E are schematic views of manufacturing a semiconductor structure by a method of FIG. 9 in accordance with some embodiments of the present disclosure.

FIGS. 10A-10E are schematic views of manufacturing a semiconductor structure by a method of FIG. 8 in accordance with some embodiments of the present disclosure.

DETAILED DESCRIPTION OF THE DISCLOSURE

Figure 1:
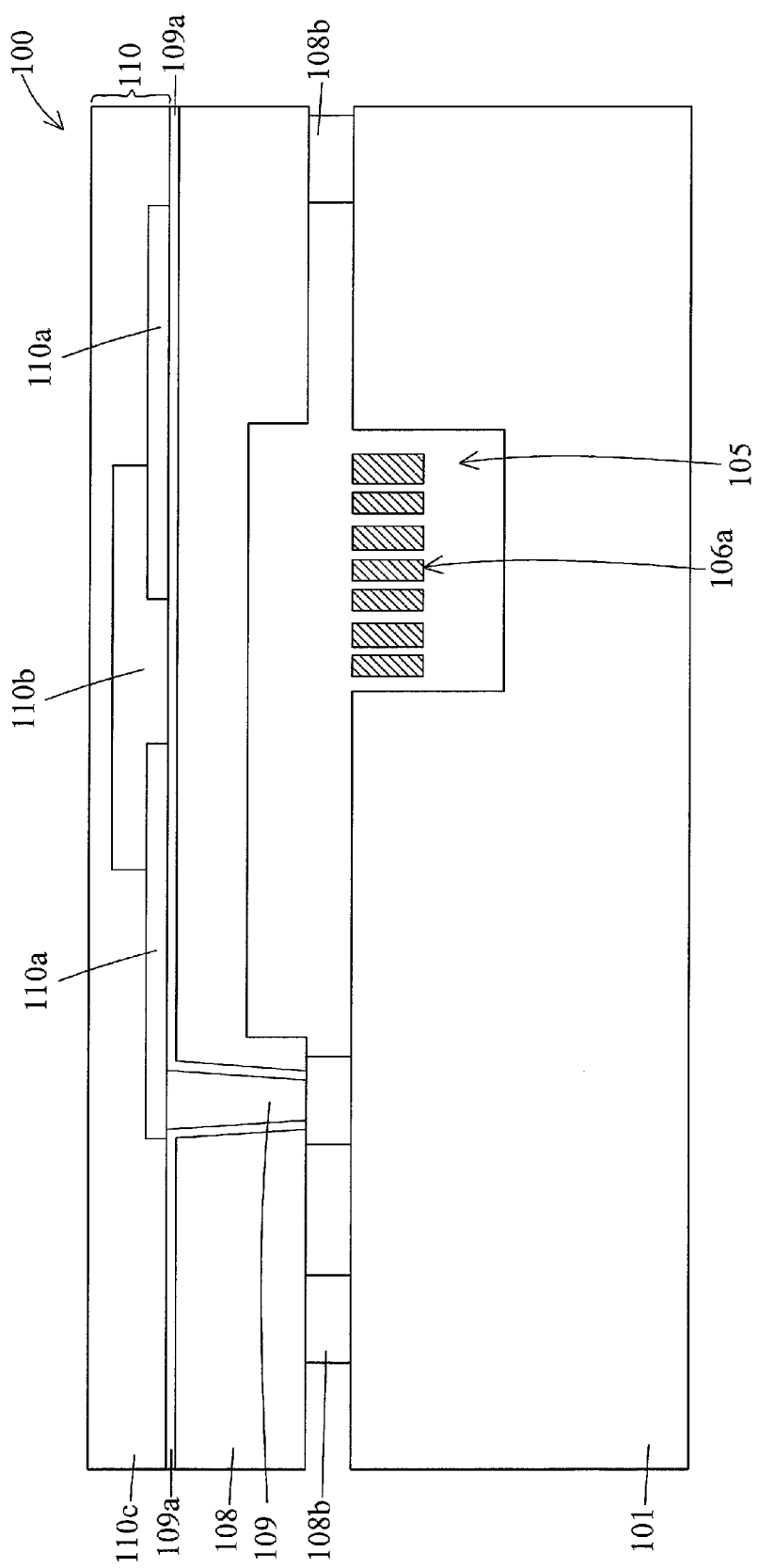
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electronic equipment can include multiple MEMS sensors, and those sensors can be integrated onto a semiconductive chip in recent generation of MEMS applications. For example, motion or inertial sensors are used for motion-activated user interfaces in consumer electronics such as smartphones, tablets, gaming consoles, and in automotive crash detection systems. To capture a complete range of movements within a three-dimensional space, motion sensors often utilize an accelerometer and a gyroscope in combination. The accelerometer detects linear movement, and the gyroscope detects angular movement. In addition, a magnetic sensor such as electronic compass is also integrated onto the chip for navigation. The magnetic sensor can determine a direction of an external magnetic field. To meet consumer's demand for low cost, high quality, and small device footprint, multiple sensors are integrated together on a same substrate.

The MEMS sensors are fabricated and integrated on the substrate by various processes. The sensors are integrated on the substrate laterally or horizontally to become the electronic equipment. The sensors are disposed adjacent to each other. However, such integration would result in an undesirably large geometric size or form factor of the electronic equipment. Further, the sensors are integrated and electrically connected by wire bonding operations. Such connection would induce parasitical capacitance and result in a high noise or a poor overall performance of the electronic equipment. In addition, the sensors are integrated with each other by wafer bonding operations which requires a high temperature. Some of the sensors are easily deteriorated by the high temperature. The high temperature may cause damage on some sensors and thus adversely affect their sensitivity or operation performance.

The present disclosure is directed to a semiconductor structure including multiple devices that are integrated on/over a substrate. The semiconductive structure includes a substrate and one or more devices disposed over the substrate and integrated by several conductive vias. The integration of the devices by the conductive vias allows stacking of the devices over each other on the substrate in order to reduce a geometric size or form factor of the semiconductor structure. Also, electrical connection of the devices by the conductive vias can reduce generation of noise and improve the performance of the semiconductor structure. Further, some of the devices can be fabricated after completion of high temperature processes such as wafer bonding operations. Those devices would not be damaged by the high temperature. As such, the devices, such as a magnetic device including anisotropic magnetoresistive (AMR) material, giant magnetoresistive (GMR) material or tunnel magnetoresistive (TMR), are easily deteriorated by high temperature (greater than about 300° C.) would not be affected by the high temperature and thus can also be formed in the semiconductor structure. Other embodiments are also disclosed.

FIG. 1 is a schematic cross sectional view of a semiconductor structure 100 in accordance with some embodiments of the present disclosure. In some embodiments, the semiconductor structure 100 is configured for sensing various characteristics such as motion, movement, magnetic field, pressure or etc. or combination thereof. In some embodiments, the semiconductor structure 100 is configured for sensing linear motion, angular motion, direction of magnetic field, etc. In some embodiments, the semiconductor structure 100 includes one or more substrates stacking over each other and one or more devices for sensing various predetermined characteristics. In some embodiments as shown in FIG. 1, the semiconductor structure 100 includes a first substrate 101, a second substrate 108, a first sensing structure 106a and a second sensing structure 110. It will be appreciated that the semiconductor structure 100 may include one or more substrates and one or more sensing structures.

In some embodiments, the semiconductor structure 100 includes the first substrate 101. In some embodiments, the first substrate 101 may include several circuitries and one or more active elements such as transistors etc. disposed over or in the first substrate 101. In some embodiments, the circuitries formed over or in the first substrate 101 may be any type of circuitry suitable for a particular application. In accordance with some embodiments, the circuitries may include various n-type metal-oxide semiconductor (NMOS) and/or p-type metal-oxide semiconductor (PMOS) devices such as transistors, capacitors, resistors, diodes, photo-diodes, fuses and/or the like. The circuitries may be interconnected to perform one or more functions. In some embodiments, the first substrate 101 includes ASIC components disposed over or in the first substrate 101. In some embodiments, the first substrate 101 includes CMOS components disposed over or in the first substrate 101. In some embodiments, the first substrate 101 includes semiconductive materials such as silicon or other suitable materials. In some embodiments, the first substrate 101 is a silicon substrate or silicon wafer. In some embodiments, the first substrate 101 is a CMOS substrate.

In some embodiments, the first sensing structure 106a is disposed over the first substrate 101. In some embodiments, the first sensing structure 106a is configured for sensing a motion such as a motion sensing device. In some embodiments, the first sensing structure 106a is a gyroscope for measuring angular velocity. In some embodiments, the first sensing structure 106a is an accelerometer for measuring linear acceleration. In some embodiments, the first sensing structure 106a includes a proof mass for reacting with a motion along a plane and a support spring for supporting the proof mass. In some embodiments, the first sensing structure 106a is a one or more axes gyroscope, a one or more axes accelerometer or a one or more axes motion sensing device.

In some embodiments, the second substrate 108 is disposed over the first substrate 101 and the first sensing structure 106a. In some embodiments, the second substrate 108 is vertically stacked over the first substrate 101. In some embodiments, the second substrate 108 is a capping substrate or capping wafer for covering the first substrate 101. In some embodiments, the second substrate 108 includes silicon or other suitable materials.

In some embodiments, a cavity 105 is disposed between the first substrate 101 and the second substrate 108. In some embodiments, the cavity 105 surrounds the first sensing structure 106a. The first sensing structure 106a is movable within the cavity 105. In some embodiments, the cavity 105 is in a vacuum or is at a gas pressure lower than about 1 atmospheric pressure (atm). In some embodiments, the first sensing structure 106a is sealed in the cavity 105.

In some embodiments, the bond pad 108b can be a combination of two distributed materials with a first bonding material deployed on the first substrate 101 and a second bonding material deployed on the second substrate 108. The first bonding material and the second bonding material may be metal-to-metal or metal-to-semiconductor. The first bonding material and the second bonding material may comprise silicon (Si) to aluminum (Al), silicon (Si) to gold (Au), germanium (Ge) to aluminum (Al), titanium (Ti) to aluminum (Al), copper (Cu) to tin (Sn), indium (In) to gold (Au) or any variety of adequate bonding layers.

In some embodiments, a via 109 is disposed within the second substrate 108. In some embodiments, the via 109 extends through the second substrate 108. In some embodiments, the via 109 electrically connects with the bond pad 108b. In some embodiments, the via 109 is disposed over the bond pad 108b. In some embodiments, the second substrate 108 is communicable with the first substrate 101 through the via 109. In some embodiments, the via 109 is a through substrate via (TSV) or a through silicon via (TSV). In some embodiments, the via 109 includes conductive material, metallic material or semiconductive material. In some embodiments, the via 109 includes gold, silver, copper, nickel, tungsten, aluminum, tin and/or alloys thereof. In some embodiments, the via 109 is a copper pillar. In some embodiments, the via 109 includes silicon, polysilicon, etc. In some embodiments, the via 109 is a silicon pillar.

In some embodiments, a first isolation layer 109a is disposed over the second substrate 108 and between the second substrate 108 and the via 109. In some embodiments, the first isolation layer 109a is conformal to a surface of the second substrate 108 and a sidewall of the via 109. In some embodiments, the first isolation layer 109a surrounds the via 109. In some embodiments, the first isolation layer 109a includes dielectric material such as oxide, silicon dioxide, silicon nitride, silicon oxynitride, silicon carbide, polymer or the like.

In some embodiments, a second sensing structure 110 is disposed over the second substrate 108. In some embodiments, the second sensing structure 110 is configured for sensing or detecting a magnetic field, determining a direction, navigation, etc. In some embodiments, the second sensing structure 110 is a magnetic field sensor, magnetic sensor, one or more axes magnetic sensor, magnetometer, geomagnetic sensor, etc. In some embodiments, the second sensing structure 110 is served as an electronic or digital compass. In some embodiments, the second sensing structure 110 is cooperated with the first sensing structure 106a to determine a direction of a motion.

In some embodiments, the second sensing structure 110 includes an interconnect structure 110a electrically connected with the via 109. In some embodiments, the interconnect structure 110a is disposed over the second substrate 108 or the first isolation layer 109a, and coupled with the via 109 so as to electrically connect with the via 109. In some embodiments, the interconnect structure 110a is electrically connected with the via 109, the bond pad 108b. In some embodiments, the second sensing structure 110 is communicable with the first substrate 101 through the interconnect structure 110a and the via 109. In some embodiments, the interconnect structure 110a is a magnetic sensing electrode configured for transmitting an electrical signal to the first substrate 101 or the second substrate 108. In some embodiments, the interconnect structure 110a is a post passivation interconnect (PPI) or is a part of a redistribution layer (RDL). In some embodiments, the interconnect structure 110a includes aluminum, copper, alumina, nickel, gold, tungsten, titanium, alloys thereof, or multi-layers thereof.

In some embodiments, the second sensing structure 110 includes a sensing material 110b at least partially covering the interconnect structure 110a. In some embodiments, the sensing material 110b is configured for sensing a magnetic field. In some embodiments, the sensing material 110b is a magnetic sensing material. In some embodiments, the interconnect structure 110a can transmit an electrical signal according to the magnetic field sensed by the sensing material 110b. For example, when the magnetic field is applied to the sensing material or around the semiconductor structure 100, an electrical resistance of the sensing material 110b would change, and the interconnect structure 110a would transmit the electrical signal according to the change of the resistance to the first substrate 101 or the second substrate 108 for further processing, and therefore the magnetic field is sensed and determined. In some embodiments, the sensing material 110b includes anisotropic magnetoresistive (AMR) material, giant magnetoresistive (GMR) material, tunnel magnetoresistive (TMR) material or any suitable materials.

In some embodiments, a second isolation layer 110c is disposed over the second substrate 108 and covering or surrounding the interconnect structure 110a and the sensing material 110b. In some embodiments, the second isolation layer 110c is configured to protect the interconnect structure 110a and the sensing material 110b. In some embodiments, the second isolation layer 110c includes dielectric material such as oxide, silicon dioxide, silicon nitride, silicon oxynitride, silicon carbide, polymer or the like.

Figure 1A:
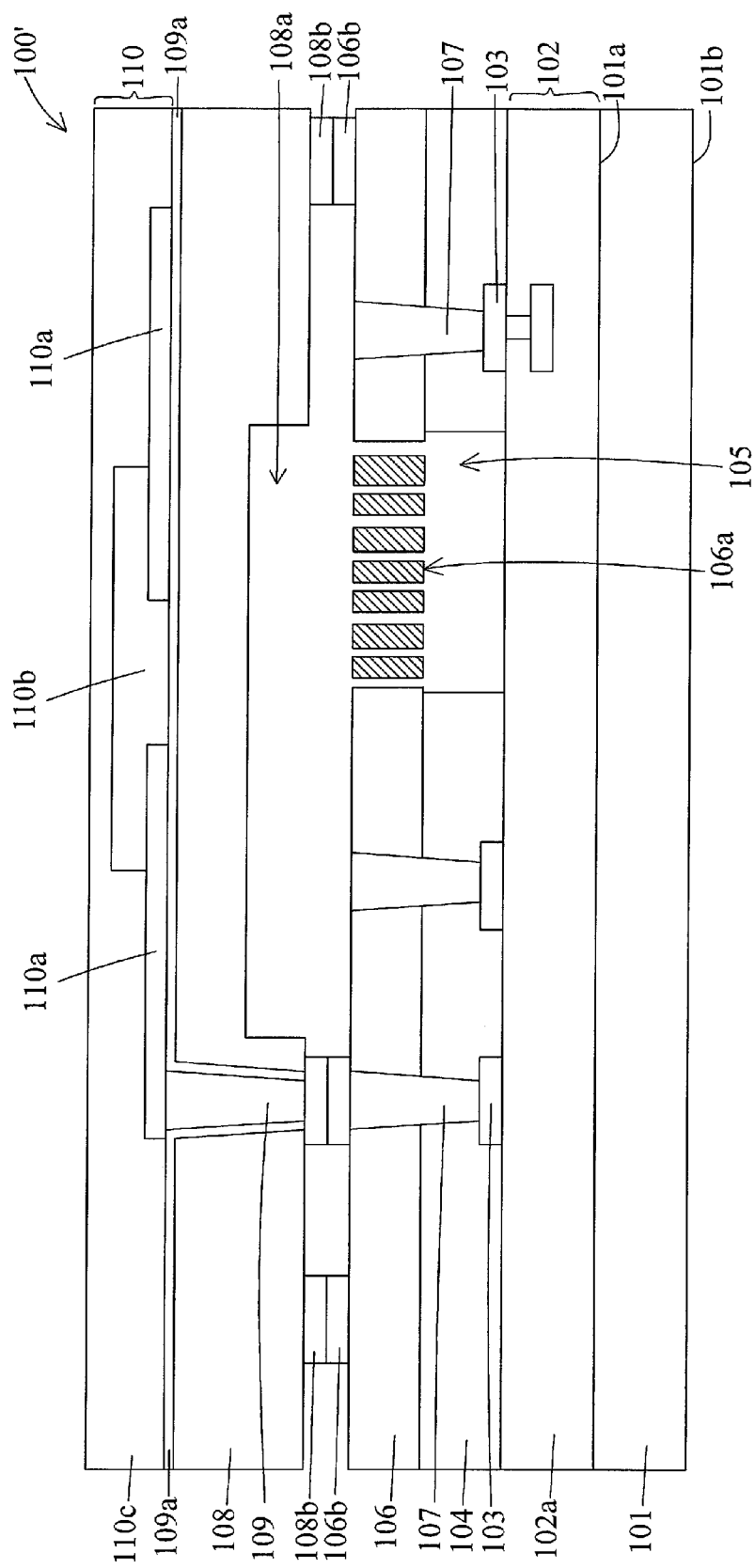
FIG. 1A is a schematic view of a semiconductor structure in accordance with some embodiments of the present disclosure.

FIG. 1A is a schematic cross sectional view of a semiconductor structure 100' in accordance with some embodiments of the present disclosure. In some embodiments, the semiconductor structure 100 is configured for sensing various characteristics such as motion, movement, magnetic field, pressure or etc. or combination thereof. In some embodiments, the semiconductor structure 100 is configured for sensing linear motion, angular motion, direction of magnetic field, etc. In some embodiments, the semiconductor structure 100 includes one or more substrates stacking over each other and one or more devices for sensing various predetermined characteristics. In some embodiments as shown in FIG. 1A, the semiconductor structure 100' includes a first substrate 101, a third substrate 106, a second substrate 108, a first sensing structure 106a and a second sensing structure 110. It will be appreciated that the semiconductor structure 100 may include one or more substrates and one or more sensing structures.

In some embodiments, the semiconductor structure 100' includes the first substrate 101. In some embodiments, the first substrate 101 may include several circuitries and one or more active elements such as transistors etc. disposed over or in the first substrate 101. In some embodiments, the circuitries formed over or in the first substrate 101 may be any type of circuitry suitable for a particular application. In accordance with some embodiments, the circuitries may include various n-type metal-oxide semiconductor (NMOS) and/or p-type metal-oxide semiconductor (PMOS) devices such as transistors, capacitors, resistors, diodes, photo-diodes, fuses and/or the like. The circuitries may be interconnected to perform one or more functions. In some embodiments, the first substrate 101 includes ASIC components disposed over or in the first substrate 101. In some embodiments, the first substrate 101 includes CMOS components disposed over or in the first substrate 101. In some embodiments, the first substrate 101 includes semiconductive materials such as silicon or other suitable materials. In some embodiments, the first substrate 101 is a silicon substrate or silicon wafer. In some embodiments, the first substrate 101 is a CMOS substrate.

In some embodiments, the first substrate 101 includes a first surface 101*a* and a second surface 101*b* opposite to the first surface 101*a*. In some embodiments, the first surface 101*a* is an active side or a front side of the first substrate 101, that several circuitries or electrical components are disposed over the first surface 101*a*. In some embodiments, the second surface 101*b* is an inactive side or a back side of the first substrate 101 where the circuitries or electrical components are absent.

In some embodiments, an intermetallic dielectric (IMD) layer 102 is disposed over the first substrate 101. In some embodiments, the IMD layer 102 is disposed on the first surface 101*a* of the first substrate 101. In some embodiments, the IMD layer 102 includes a conductive structure 103 and a dielectric material 102*a* surrounding the conductive structure 103. In some embodiments, the conductive structure 103 is disposed over or within the IMD layer 102. In some embodiments, the conductive structure 103 is electrically connected with a circuitry or element in the first substrate 101. In some embodiments, the conductive structure 103 includes copper, aluminum, tungsten, etc. In some embodiments, the dielectric material 102*a* includes oxide, silicon dioxide, silicon nitride, silicon oxynitride, silicon carbide, polymer or the like.

In some embodiments, a dielectric layer 104 is disposed over the IMD layer 102. In some embodiments, the dielectric layer 104 is disposed over or covers the conductive structure 103. In some embodiments, the dielectric layer 104 includes oxide, silicon dioxide, silicon nitride, silicon oxynitride, silicon carbide, polymer or the like. In some embodiments, a first cavity 105 is disposed within the dielectric layer 104. The first cavity 105 extends through the dielectric layer 104. In some embodiments, the first cavity 105 is extended through the dielectric layer 104 to the dielectric material 102*a* of the IMD 102. In some embodiments, the dielectric layer 104 includes same or different materials from the dielectric material 102*a*.

In some embodiments, the third substrate 106 is disposed over the first substrate 101. In some embodiments, the third substrate 106 is disposed on the dielectric layer 104. In some embodiments, the third substrate 106 is bonded over the first substrate 101. In some embodiments, the third substrate 106 is vertically stacked over the first substrate 101. In some embodiments, the third substrate 106 is directly bonded with the dielectric layer 104. In some embodiments, the third substrate 106 includes silicon, glass, ceramic or other suitable materials. In some embodiments, the third substrate 106 is a silicon substrate or silicon wafer. In some embodiments, the third substrate 106 is a MEMS substrate. In some embodiments, the third substrate 106 includes electrical circuits formed on or in the third substrate 106. In some embodiments, the third substrate 106 includes transistors, capacitors, resistors, diodes, photo-diodes and/or the like. In some embodiments, the third substrate 106 includes a MEMS device or a MEMS component.

In some embodiments, the third substrate 106 includes a first sensing structure 106*a*. In some embodiments, the first sensing structure 106*a* is configured for sensing a motion such as a motion sensing device. In some embodiments, the first sensing structure 106*a* is a gyroscope for measuring angular velocity. In some embodiments, the first sensing structure 106*a* is an accelerometer for measuring linear acceleration. In some embodiments, the first sensing structure 106*a* includes a proof mass for reacting with a motion along a plane and a support spring for supporting the proof mass. In some embodiments, the first sensing structure 106*a* is a one or more axes gyroscope, a one or more axes accelerometer or a one or more axes motion sensing device. In some embodiments, the first sensing structure 106*a* is disposed over or aligned with the first cavity 105. In some embodiments, the first sensing structure 106*a* is movable within the first cavity 105 and relative to the first substrate 101, the IMD layer 102 or the dielectric layer 104.

In some embodiments, a plug 107 is disposed within the third substrate 106. In some embodiments, the plug 107 passes through the third substrate 106 and electrically connects with the conductive structure 103. In some embodiments, the plug 107 is disposed over the first substrate 101. In some embodiments, the plug 107 extends through the third substrate 106 and the dielectric layer 104, and couples with at least a portion of the conductive structure 103. In some embodiments, the plug 107 includes conductive material such as gold, silver, copper, nickel, tungsten, aluminum, tin and/or alloys thereof.

In some embodiments, a first bond pad 106*b* is disposed over the third substrate 106. In some embodiments, the first bond pad 106*b* is configured to receive a connecting structure. In some embodiments, the first bond pad 106*b* is disposed over the plug 107 or the conductive structure 103. In some embodiments, the first bond pad 106*b*, the plug 107 and the conductive structure 103 are electrically connected. In some embodiments the first bond pad 106*b* includes aluminum, copper, titanium, gold, nickel or other suitable materials.

In some embodiments, the second substrate 108 is disposed over the third substrate 106. In some embodiments, the second substrate 108 is vertically stacked over the third substrate 106 or the first substrate 101. In some embodiments, the second substrate 108 is disposed over the dielectric layer 104 and the IMD layer 102. In some embodiments, the second substrate 108 is a capping substrate or capping wafer for covering the first substrate 101 and the third substrate 106. In some embodiments, the second substrate 108 includes silicon or other suitable materials.

In some embodiments, the second substrate 108 includes a second cavity 108*a* within the second substrate 108. In some embodiments, the second cavity 108*a* extends through a portion of the second substrate 108 and away from the first substrate 101 or the third substrate 106. In some embodiments, the second cavity 108*a* is disposed over the first sensing structure 106*a* and the first cavity 105. In some embodiments, the first cavity 105 and the second cavity 108*a* are cooperated and aligned with each other so as to become a cavity (the first cavity 105 and the second cavity 108*a*) which allows the first sensing structure 106*a* moving therein. In some embodiments, the cavity (the first cavity 105 and the second cavity 108*a*) is defined by the first substrate 101 and the second substrate 108 and surrounds the first sensing structure 106*a*. The first sensing structure 106*a* is movable within the cavity (the first cavity 105 and the second cavity 108*a*) defined by the first substrate 101 and the second substrate 108. In some embodiments, the cavity (the first cavity 105 and the second cavity 108*a*) is in a vacuum or is at a gas pressure lower than about 1 atmospheric pressure (atm). In some embodiments, the first sensing structure 106a is sealed in the cavity (the first cavity 105 and the second cavity 108a).

In some embodiments, a second bond pad 108b is disposed over the second substrate 108. In some embodiments, the second bond pad 108b is disposed between the second substrate 108 and the third substrate 106. In some embodiments, the second bond pad 108b is disposed opposite to and aligned with the first bond pad 106b. In some embodiments, the second bond pad 108b is electrically connected with the first bond pad 106b. In some embodiments, the second bond pad 108b is disposed over and electrically connected with the plug 107 and the conductive structure 103 through the first bond pad 106b. In some embodiments, the second bond pad 108b includes germanium, silicon or other suitable materials. In some embodiments, the second bond pad 108b is bonded with the first bond pad 106b, such that the second substrate 108 is bonded with the third substrate 106. In some embodiments, the second bond pad 108b is eutectically bonded with the first bond pad 106b. In some embodiments, the first bond pad 106b and the second bond pad 108b can be a materials combination of silicon (Si) to aluminum (Al), silicon (Si) to gold (Au), germanium (Ge) to aluminum (Al), titanium (Ti) to aluminum (Al), copper (Cu) to tin (Sn), indium (In) to gold (Au) or any variety of adequate bonding layers.

In some embodiments, a via 109 is disposed within the second substrate 108. In some embodiments, the via 109 passes through the second substrate 108 and electrically connects with the plug 107 and the conductive structure 103. In some embodiments, the via 109 electrically connects with the plug 107 through the first bond pad 106b and the second bond pad 108b. In some embodiments, the via 109 is disposed over the second bond pad 108b, the first bond pad 106b, the plug 107 or the conductive structure 103. The second bond pad 108b is disposed over the via 109 and the second substrate 108. In some embodiments, the second bond pad 108b is coupled with the via 109. In some embodiments, the second substrate 108 is communicable with the third substrate 106 or the first substrate 101 through the via 109 and the plug 107. In some embodiments, the via 109 is a through substrate via (TSV) or a through silicon via (TSV). In some embodiments, the via 109 includes conductive material, metallic material or semiconductive material. In some embodiments, the via 109 includes gold, silver, copper, nickel, tungsten, aluminum, tin and/or alloys thereof. In some embodiments, the via 109 is a copper pillar. In some embodiments, the via 109 includes silicon, polysilicon, etc. In some embodiments, the via 109 is a silicon pillar.

In some embodiments, a first isolation layer 109a is disposed over the second substrate 108 and between the second substrate 108 and the via 109. In some embodiments, the first isolation layer 109a is conformal to a surface of the second substrate 108 and a sidewall of the via 109. In some embodiments, the first isolation layer 109a surrounds the via 109. In some embodiments, the first isolation layer 109a includes dielectric material such as oxide, silicon dioxide, silicon nitride, silicon oxynitride, silicon carbide, polymer or the like.

In some embodiments, a second sensing structure 110 is disposed over the second substrate 108. In some embodiments, the second sensing structure 110 is configured for sensing or detecting a magnetic field, determining a direction, navigation, etc. In some embodiments, the second sensing structure 110 is a magnetic field sensor, magnetic sensor, one or more axes magnetic sensor, magnetometer, geomagnetic sensor, etc. In some embodiments, the second sensing structure 110 is served as an electronic or digital compass. In some embodiments, the second sensing structure 110 is cooperated with the first sensing structure 106a to determine a direction of a motion.

In some embodiments, the second sensing structure 110 includes an interconnect structure 110a electrically connected with the via 109. In some embodiments, the interconnect structure 110a is disposed over the second substrate 108 or the first isolation layer 109a, and coupled with the via 109 so as to electrically connect with the via 109. In some embodiments, the interconnect structure 110a is electrically connected with the via 109, the second bond pad 108b, the first bond pad 106b, the plug 107 or the conductive structure 103. In some embodiments, the second sensing structure 110 is communicable with the first substrate 101 or the third substrate 106 through the interconnect structure 110a and the via 109. In some embodiments, the interconnect structure 110a is a magnetic sensing electrode configured for transmitting an electrical signal to the first substrate 101, the third substrate 106 or the second substrate 108. In some embodiments, the interconnect structure 110a is a post passivation interconnect (PPI) or is a part of a redistribution layer (RDL). In some embodiments, the interconnect structure 110a includes aluminum, copper, alumina, nickel, gold, tungsten, titanium, alloys thereof, or multi-layers thereof.

In some embodiments, the second sensing structure 110 includes a sensing material 110b at least partially covering the interconnect structure 110a. In some embodiments, the sensing material 110b is configured for sensing a magnetic field. In some embodiments, the sensing material 110b is a magnetic sensing material. In some embodiments, the interconnect structure 110a can transmit an electrical signal according to the magnetic field sensed by the sensing material 110b. For example, when the magnetic field is applied to the sensing material or around the semiconductor structure 100, an electrical resistance of the sensing material 110b would change, and the interconnect structure 110a would transmit the electrical signal according to the change of the resistance to the first substrate 101, the third substrate 106 or the second substrate 108 for further processing, and therefore the magnetic field is sensed and determined. In some embodiments, the sensing material 110b includes anisotropic magnetoresistive (AMR) material, giant magnetoresistive (GMR) material, tunnel magnetoresistive (TMR) material or any suitable materials.

In some embodiments, a second isolation layer 110c is disposed over the second substrate 108 and covering or surrounding the interconnect structure 110a and the sensing material 110b. In some embodiments, the second isolation layer 110c is configured to protect the interconnect structure 110a and the sensing material 110b. In some embodiments, the second isolation layer 110c includes dielectric material such as oxide, silicon dioxide, silicon nitride, silicon oxynitride, silicon carbide, polymer or the like.

Figure 2:
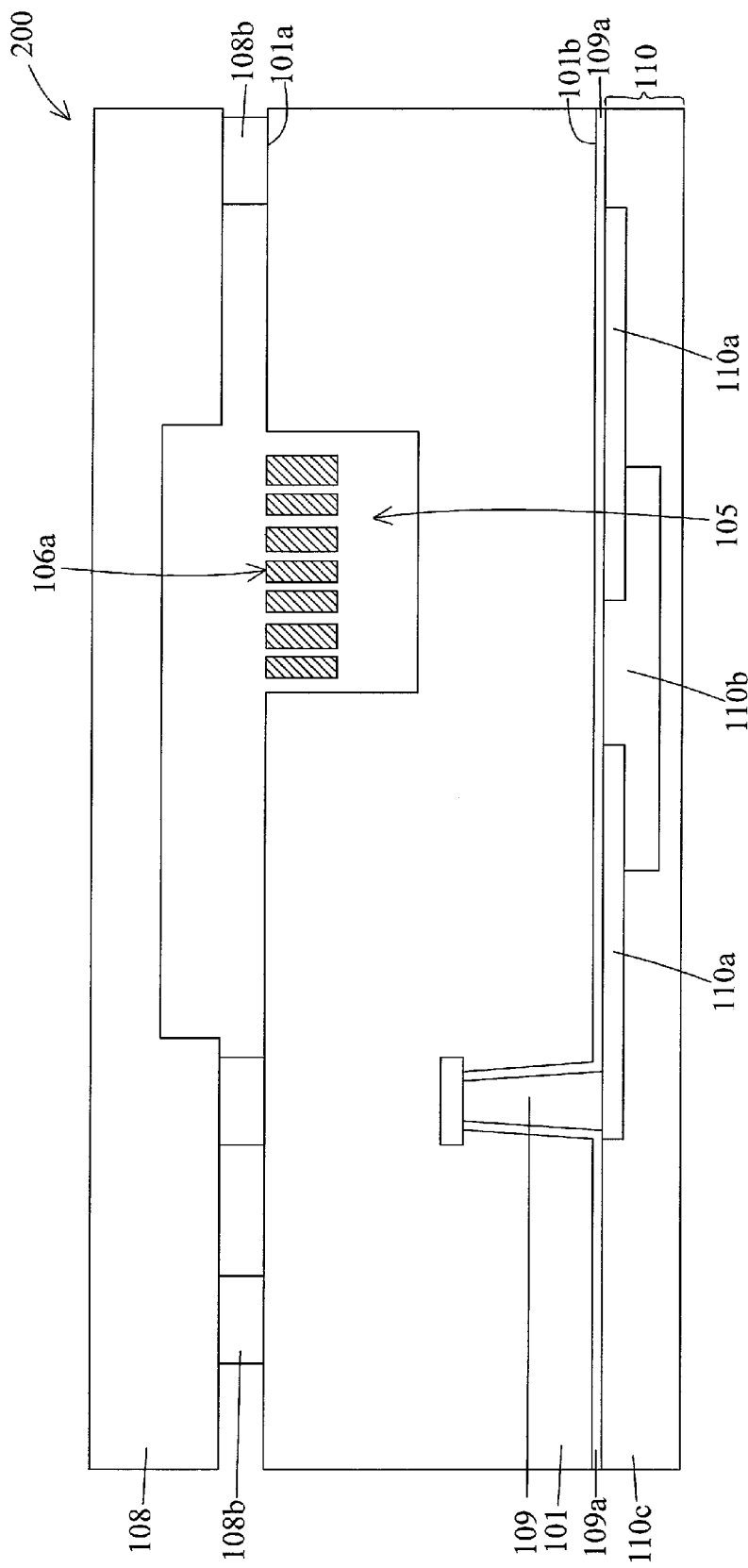
FIG. 2 is a schematic view of a semiconductor structure in accordance with some embodiments of the present disclosure.

FIG. 2 is a schematic cross sectional view of a semiconductor structure 200 in accordance with some embodiments of the present disclosure. In some embodiments, the semiconductor structure 200 includes a first substrate 101, a second substrate 108, a first sensing structure 106a and a cavity 105, which are in similar configuration as described above and illustrated in FIG. 1. In some embodiments as in FIG. 2, the semiconductor structure 200 includes a second sensing structure 110 disposed over a second surface 101b or a back side of the first substrate 101, and a via 109 extending through the first substrate 101.

In some embodiments, the via 109 extends from the second surface 101*b* and within the first substrate 101. In some embodiments, the via 109 is a TSV. In some embodiments, the via 109 includes conductive material, metallic material or semiconductive material. In some embodiments, the via 109 includes gold, silver, copper, nickel, tungsten, aluminum, tin and/or alloys thereof. In some embodiments, the via 109 is a copper pillar. In some embodiments, the via 109 includes silicon, polysilicon, etc. In some embodiments, the via 109 is a silicon pillar.

In some embodiments, a first isolation layer 109*a* is disposed over the second surface 101*b* of the first substrate 101 and between the via 109 and the first substrate 101. In some embodiments, the first isolation layer 109*a* is conformal to the second surface of the first substrate 101 and a sidewall of the via 109. In some embodiments, the first isolation layer 109*a* surrounds the via 109. In some embodiments, the first isolation layer 109*a* includes dielectric material such as oxide, silicon dioxide, silicon nitride, silicon oxynitride, silicon carbide, polymer or the like.

In some embodiments, the second sensing structure 110 is disposed over the first substrate 101. In some embodiments, an interconnect structure 110*a*, a sensing material 110*b* and a second isolation layer 110*c* are disposed over the first substrate 101. In some embodiments, the interconnect structure 110*a* is disposed over the first isolation layer 109*a*. In some embodiments, the interconnect structure 110*a* is disposed over and electrically connected with the via 109. In some embodiments, the interconnect structure 110*a* is a magnetic sensing electrode configured for transmitting an electrical signal to the first substrate 101 or the second substrate 108. In some embodiments, the interconnect structure 110*a* is a post passivation interconnect (PPI) or is a part of a redistribution layer (RDL). In some embodiments, the interconnect structure 110*a* includes aluminum, copper, alumina, nickel, gold, tungsten, titanium, alloys thereof, or multi-layers thereof.

In some embodiments, the sensing material 110*b* is disposed over the first substrate 101 and at least partially covers the interconnect structure 110*a*. In some embodiments, the sensing material 110*b* is configured for sensing a magnetic field such as a magnetic sensing material. In some embodiments, the interconnect structure 110*a* can transmit an electrical signal according to the magnetic field sensed by the sensing material 110*b*. In some embodiments, the sensing material 110*b* includes AMR material, GMR material, TMR material or any suitable materials.

In some embodiments, the second isolation layer 110*c* is disposed over the first substrate 101 and covering or surrounding the interconnect structure 110*a* and the sensing material 110*b*. In some embodiments, the second isolation layer 110*c* is configured to protect the interconnect structure 110*a* and the sensing material 110*b*. In some embodiments, the second isolation layer 110*c* includes dielectric material such as oxide, silicon dioxide, silicon nitride, silicon oxynitride, silicon carbide, polymer or the like.

Figure 2A:
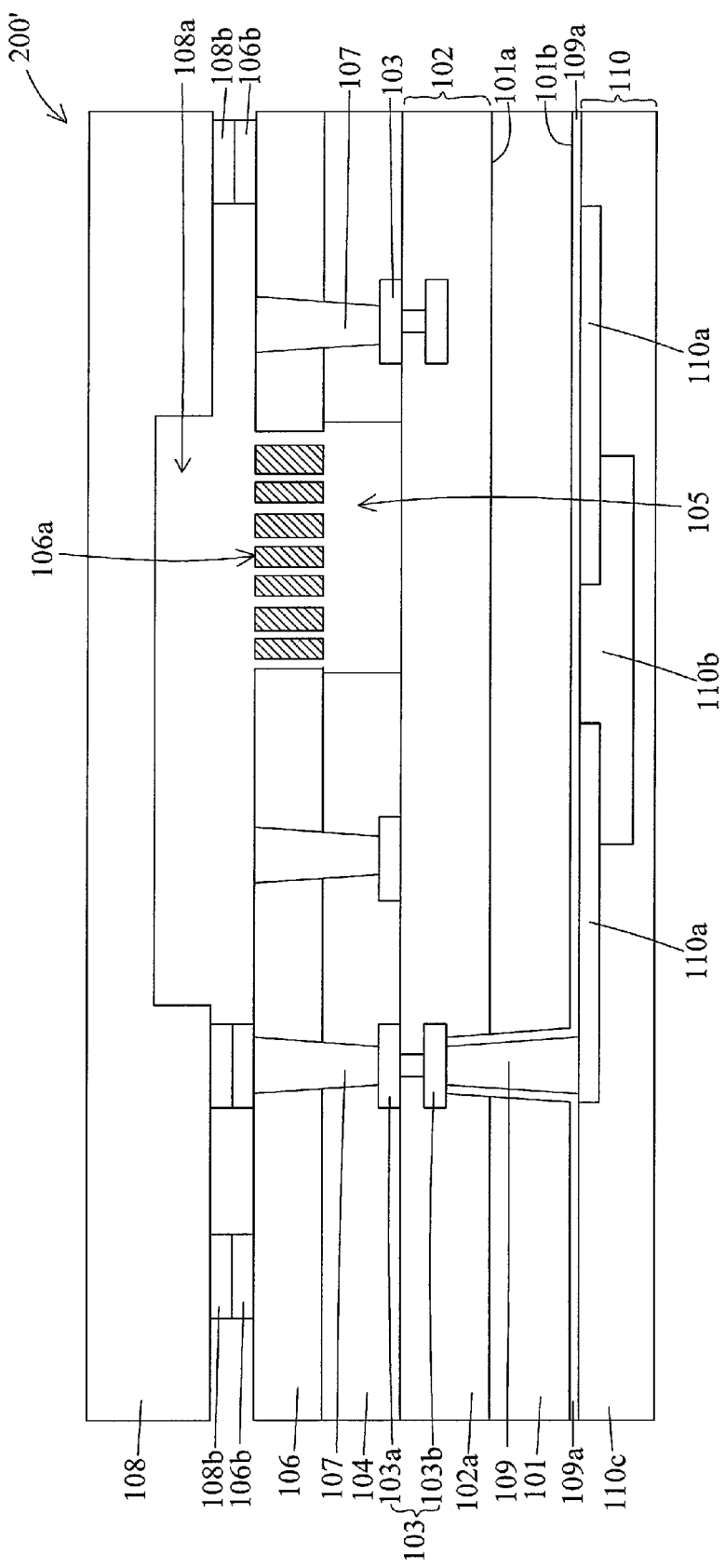
FIG. 2A is a schematic view of a semiconductor structure in accordance with some embodiments of the present disclosure.

FIG. 2A is a schematic cross sectional view of a semiconductor structure 200' in accordance with some embodiments of the present disclosure. In some embodiments, the semiconductor structure 200' includes a first substrate 101, an intermetallic dielectric (IMD) layer 102, a dielectric layer 104, a third substrate 106, a plug 107, a second substrate 108 and a cavity (a first cavity 105 and a second cavity 108*a*), which are in similar configuration as described above and illustrated in FIG. 1A. In some embodiments as in FIG. 2A, the semiconductor structure 200 includes a second sensing structure 110 disposed over a second surface 101*b* or a back side of the first substrate 101, and a via 109 extending through the first substrate 101.

In some embodiments, a conductive structure 103 disposed over or within a dielectric material 102*a* of the IMD layer 102 includes a top portion 103*a* and a bottom portion 103*b*. In some embodiments, the top portion 103*a* is disposed over and electrically connected with the bottom portion 103*b*. In some embodiments, the top portion 103*a* is a top metal layer, and the bottom portion 103*b* is a bottom metal layer. In some embodiments, the top portion 103*a* is proximal to the third substrate 106 and distal to the first substrate 101, and the bottom portion 103*b* is proximal to the first substrate 101. In some embodiments, the top portion 103*a* of the conductive structure 103 is disposed over or coupled with the plug 107. In some embodiments, the via 109 extends from the second surface 101*b* of the first substrate 101 to the first substrate 101*a* of the first substrate 101, and disposed over or couples with the bottom portion 103*b* of the conductive structure 103. In some embodiments, the via 109 is electrically connected with the bottom portion 103*b* of the conductive structure 103. In some embodiments, the via 109 extends through the first substrate 101 to the IMD layer 102. In some embodiments, the via 109 is a TSV. In some embodiments, the via 109 includes conductive material, metallic material or semiconductive material. In some embodiments, the via 109 includes gold, silver, copper, nickel, tungsten, aluminum, tin and/or alloys thereof. In some embodiments, the via 109 is a copper pillar. In some embodiments, the via 109 includes silicon, polysilicon, etc. In some embodiments, the via 109 is a silicon pillar.

In some embodiments, a first isolation layer 109*a* is disposed over the second surface 101*b* of the first substrate 101 and between the via 109 and the first substrate 101 or the IMD layer 102. In some embodiments, the first isolation layer 109*a* is conformal to the second surface of the first substrate 101 and a sidewall of the via 109. In some embodiments, the first isolation layer 109*a* surrounds the via 109. In some embodiments, the first isolation layer 109*a* includes dielectric material such as oxide, silicon dioxide, silicon nitride, silicon oxynitride, silicon carbide, polymer or the like.

In some embodiments, the second sensing structure 110 is disposed over the first substrate 101. In some embodiments, an interconnect structure 110*a*, a sensing material 110*b* and a second isolation layer 110*c* are disposed over the first substrate 101. In some embodiments, the interconnect structure 110*a* is disposed over the first isolation layer 109*a*. In some embodiments, the interconnect structure 110*a* is disposed over the via 109, such that the interconnect structure 110*a* is electrically connected with the conductive structure 103 through the via 109. In some embodiments, the interconnect structure 110*a*, the via 109, the conductive structure 103 and the plug 107 are electrically connected. In some embodiments, the interconnect structure 110*a* is a magnetic sensing electrode configured for transmitting an electrical signal to the first substrate 101, the third substrate 106 or the second substrate 108. In some embodiments, the interconnect structure 110*a* is a post passivation interconnect (PPI) or is a part of a redistribution layer (RDL). In some embodiments, the interconnect structure 110*a* includes aluminum, copper, alumina, nickel, gold, tungsten, titanium, alloys thereof, or multi-layers thereof.

In some embodiments, the sensing material 110*b* is disposed over the first substrate 101 and at least partially covers the interconnect structure 110*a*. In some embodiments, the sensing material 110*b* is configured for sensing a magnetic field such as a magnetic sensing material. In some embodiments, the interconnect structure 110a can transmit an electrical signal according to the magnetic field sensed by the sensing material 110b. In some embodiments, the sensing material 110b includes AMR material, GMR material, TMR material or any suitable materials.

In some embodiments, the second isolation layer 110c is disposed over the first substrate 101 and covering or surrounding the interconnect structure 110a and the sensing material 110b. In some embodiments, the second isolation layer 110c is configured to protect the interconnect structure 110a and the sensing material 110b. In some embodiments, the second isolation layer 110c includes dielectric material such as oxide, silicon dioxide, silicon nitride, silicon oxynitride, silicon carbide, polymer or the like.

Figure 3:
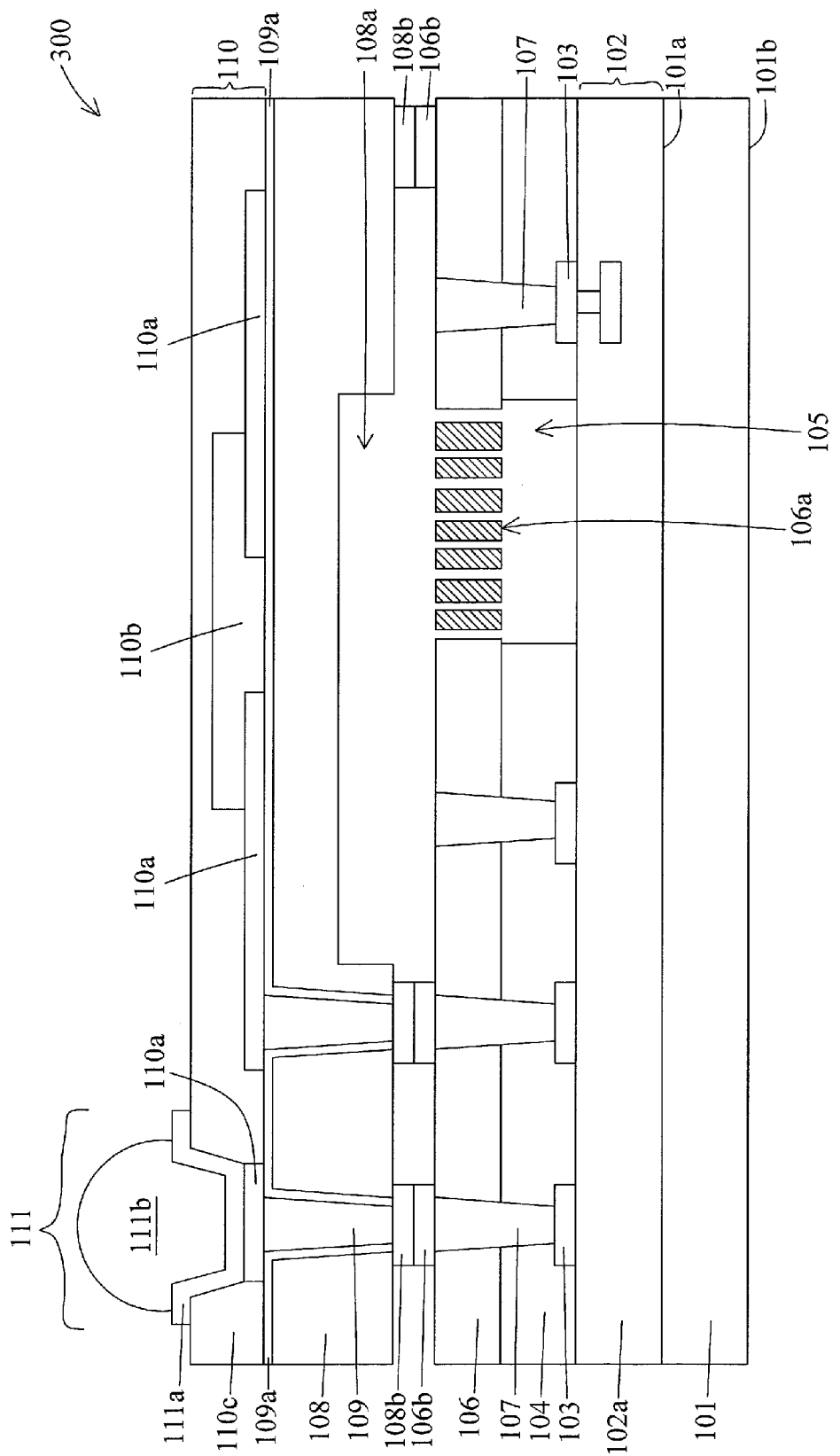
FIG. 3 is a schematic view of a semiconductor structure in accordance with some embodiments of the present disclosure.

FIG. 3 is a schematic cross sectional view of a semiconductor structure 300 in accordance with some embodiments of the present disclosure. In some embodiments, the semiconductor structure 300 has similar configuration as the semiconductor structure 100 described above and illustrated in FIG. 1 or the semiconductor structure 100' described above and illustrated in FIG. 1A. In some embodiments as in FIG. 3, the semiconductor structure 300 includes a connection structure 111 disposed over the second substrate 108. In some embodiments, the connection structure 111 electrically connects the first substrate 101, the third substrate 106 or the second substrate 108 with an external circuitry or component. In some embodiments, the connection structure 111 includes a under bump metallization (UBM) pad 111a and a conductive bump 111b, which are disposed over the second substrate 108, the second sensing structure 110 or the interconnect structure 110a.

In some embodiments, the UBM pad 111a is disposed over or electrically connected with a portion of the interconnect structure 110a. In some embodiments, the UBM pad 111a is electrically connected with the via 109 through the interconnect structure 110a. In some embodiments, the UBM pad 111a is disposed over or extended through the second isolation layer 110c to the interconnect structure 110a. In some embodiments, the UBM pad 111a is disposed over the portion of the interconnect structure 110a, the via 109 or the plug 107. In some embodiments, the UBM pad 111a serves as a platform for receiving a conductive material and for electrically connecting with an external circuitry or component. In some embodiments, the UBM pad 111a is electrically connected with the first substrate 101, the third substrate 106 or the second substrate 108 through the interconnect structure 110a, the via 109 or the plug 107. In some embodiments, the UBM pad 111a is a metallurgical layer or a metallurgical stack film over the interconnect structure 110a and the second isolation layer 110c. In some embodiments, the UBM pad 111a includes metal or metal alloy such as gold, silver, copper, nickel, tungsten, aluminum, palladium and/or alloys thereof.

In some embodiments, the conductive bump 111b is disposed over the UBM pad 111a. In some embodiments, the conductive bump 111b is received by the UBM pad and is configured to electrically connect with an external circuitry or component. In some embodiments, the conductive bump 111b is mountable over another substrate or a circuit board. In some embodiments, the conductive bump 111b includes reflowable material such as solder, lead, tin, copper, gold, nickel, etc. or metal alloy such as combination of lead, tin copper, gold, nickel, etc. In some embodiments, the conductive bump 111b includes a solder paste mixture of metallic powders and flux. In some embodiments, the conductive bump 111b is a ball grid array (BGA) ball, controlled collapse chip connection (C4) bump, microbump or the like.

In some embodiments, the conductive bump 111b is in a spherical or hemispherical shape. In some embodiments, the conductive bump 111b is in a cylindrical shape. In some embodiments, the conductive bump 111b is a solder ball, a metal pillar, or the like.

Figure 4:
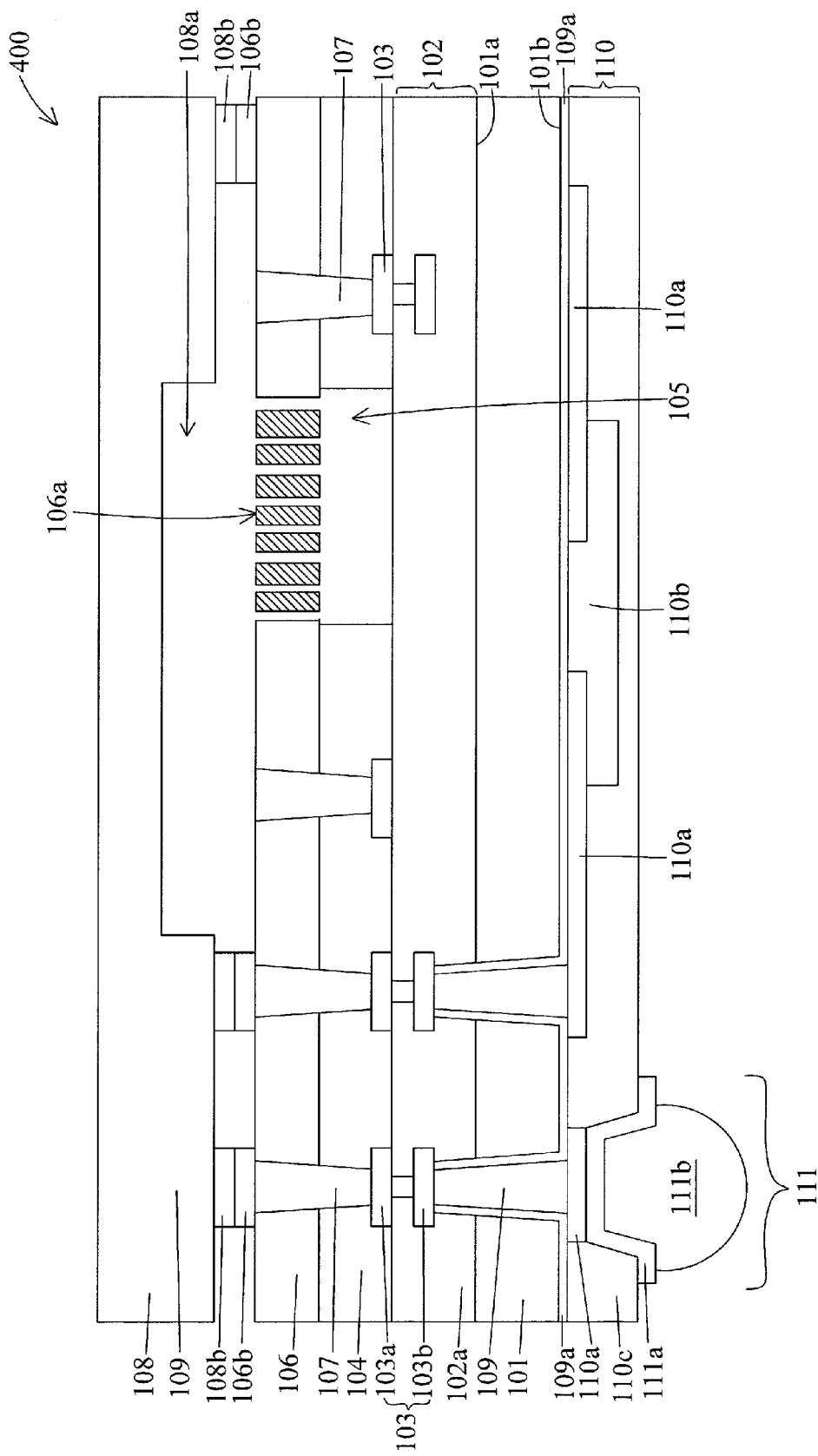
FIG. 4 is a schematic view of a semiconductor structure in accordance with some embodiments of the present disclosure.

FIG. 4 is a schematic cross sectional view of a semiconductor structure 400 in accordance with some embodiments of the present disclosure. In some embodiments, the semiconductor structure 400 has similar configuration as the semiconductor structure 200 described above and illustrated in FIG. 2 or the semiconductor structure 200' described above and illustrated in FIG. 2A. In some embodiments as in FIG. 4, the semiconductor structure 300 includes a connection structure 111 disposed over the first substrate 101. In some embodiments, the connection structure 111 electrically connects the first substrate 101, the third substrate 106 or the second substrate 108 with an external circuitry or component. In some embodiments, the connection structure 111 includes a UBM pad 111a and a conductive bump 111b, which are disposed over the first substrate 101 or the second surface 101b of the first substrate 101.

In some embodiments, the UBM pad 111a is disposed over or electrically connected with a portion of the interconnect structure 110a. In some embodiments, the UBM pad 111a is electrically connected with the via 109 through the interconnect structure 110a. In some embodiments, the UBM pad 111a is disposed over or extended through the second isolation layer 110c to the interconnect structure 110a. In some embodiments, the UBM pad 111a is electrically connected with the first substrate 101, the third substrate 106 or the second substrate 108 through the interconnect structure 110a, the via 109 or the plug 107. In some embodiments, the UBM pad 111a is a metallurgical layer or a metallurgical stack film over the interconnect structure 110a and the second isolation layer 110c. In some embodiments, the UBM pad 111a includes metal or metal alloy such as gold, silver, copper, nickel, tungsten, aluminum, palladium and/or alloys thereof.

In some embodiments, the conductive bump 111b is disposed over the UBM pad 111a. In some embodiments, the conductive bump 111b is received by the UBM pad and is configured to electrically connect with an external circuitry or component. In some embodiments, the conductive bump 111b is mountable over another substrate or a circuit board. In some embodiments, the conductive bump 111b includes reflowable material such as solder, lead, tin, copper, gold, nickel, etc. or metal alloy such as combination of lead, tin copper, gold, nickel, etc. In some embodiments, the conductive bump 111b is a BGA ball, C4 bump, microbump or the like. In some embodiments, the conductive bump 111b is in spherical, hemispherical, cylindrical or other suitable shapes. In some embodiments, the conductive bump 111b is a solder ball, a metal pillar, or the like.

Figure 5:
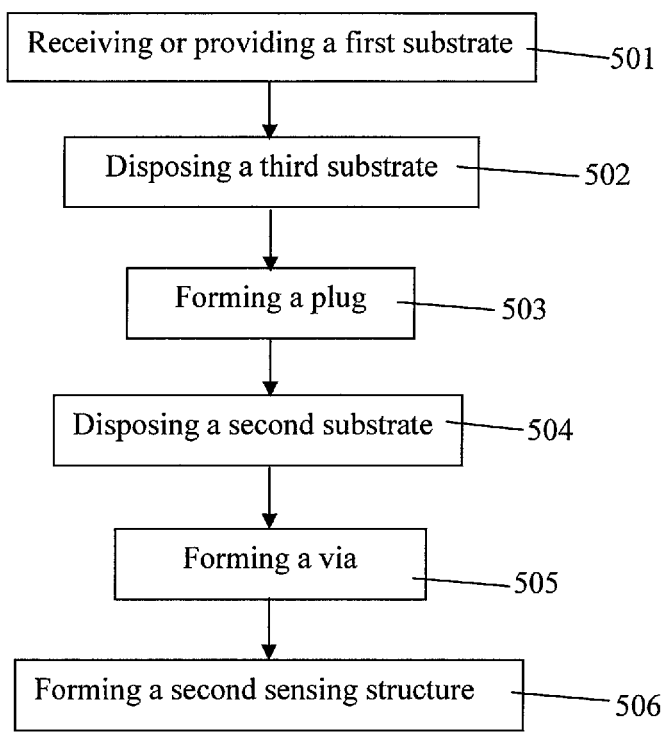
FIG. 5 is a flow diagram of a method of manufacturing a semiconductor structure in accordance with some embodiments of the present disclosure.

In the present disclosure, a method of manufacturing a semiconductor structure 100' is also disclosed. In some embodiments, a semiconductor structure 100' is formed by a method 500. The method 500 includes a number of operations and the description and illustration are not deemed as a limitation as the sequence of the operations. FIG. 5 is an embodiment of a method 500 of manufacturing a semiconductor structure 100. The method 500 includes a number of operations (501, 502, 503, 504, 505 and 506).

Figure 5A:
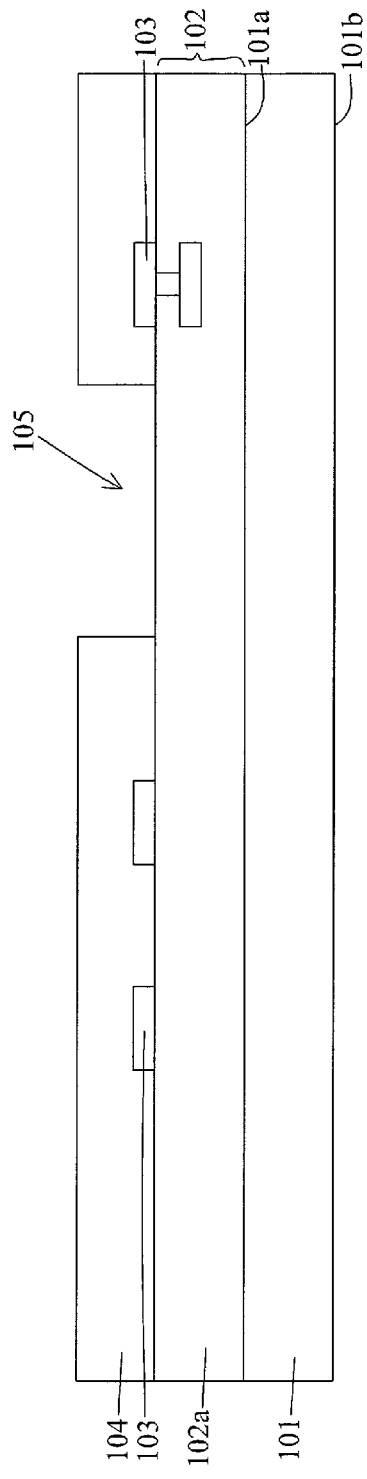
FIGS. 5A-5F are schematic views of manufacturing a semiconductor structure by a method of FIG. 5 in accordance with some embodiments of the present disclosure.

In operation 501, a first substrate 101 is received or provided as shown in FIG. 5A. In some embodiments, the first substrate 101 includes a first surface 101a and a second surface 101b opposite to the first surface 101a. In some embodiments, the first substrate 101 includes several circuitries and several active elements such as transistors etc. disposed over or in the first substrate 101. In some embodiments, the first substrate 101 includes components such as CMOS components, ASIC components, etc. disposed over or in the first substrate 101. In some embodiments, the first substrate 101 includes semiconductive materials such as silicon or other suitable materials. In some embodiments, the first substrate 101 is a silicon substrate or a silicon wafer. In some embodiments, the first substrate 101 is a CMOS substrate.

In some embodiments, an IMD layer 102 is formed over the first substrate 101. In some embodiments, the IMD layer 102 including a dielectric material 102a and a conductive structure 103 is disposed over or within the first substrate 101. In some embodiments, the IMD layer 102 is formed by disposing the dielectric material 102a over the first substrate 101 by chemical vapor deposition (CVD) operations or other suitable operations, removing some portions of the dielectric material 102a by etching operations or other suitable operations, disposing a conductive material by electroplating, sputtering or other suitable operations, and patterning the conductive material to become the conductive structure 103 by photolithography and etching operations or other suitable operations.

In some embodiments, a dielectric layer 104 is disposed over the IMD layer 102, the conductive structure 103 or the first substrate 101. In some embodiments, the dielectric layer 104 is disposed by CVD operations or other suitable operations. In some embodiments, a first cavity 105 extending through the dielectric layer 104 is formed. The first cavity 105 extends from the dielectric layer 104 to the IMD layer 102 or the first substrate 101. In some embodiments, the first cavity 105 is formed by removing a portion of the dielectric layer 104 by photolithography and etching operations or other suitable operations.

Figure 5B:
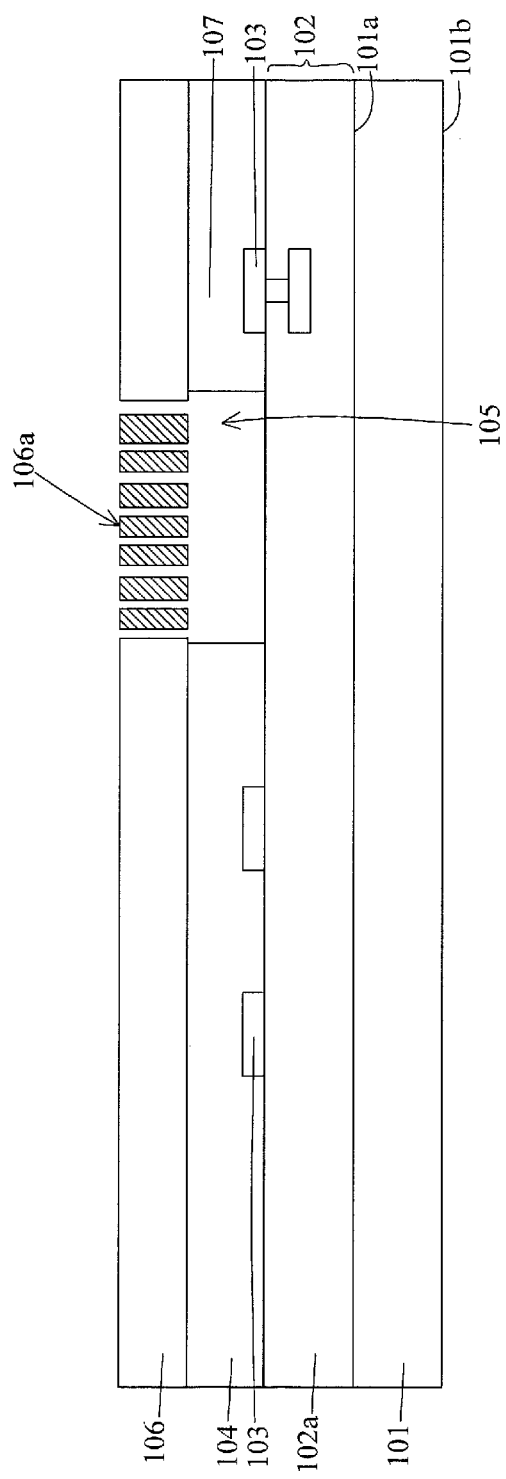

In operation 502, a third substrate 106 is disposed over the first substrate 101 as shown in FIG. 5B. In some embodiments, the third substrate 106 is a silicon substrate or silicon wafer. In some embodiments, the third substrate 106 is a MEMS substrate. In some embodiments, the third substrate 106 includes electrical circuits formed on or in the third substrate 106. In some embodiments, the third substrate 106 including a first sensing structure 106a is disposed over the dielectric layer 104, the IMD layer 102 or the first substrate 101. In some embodiments, the first sensing structure 106a is configured for sensing a motion such as a motion sensing device. In some embodiments, the first sensing structure 106a is a gyroscope, an accelerometer, a one or more axes gyroscope, a one or more axes accelerometer or a one or more axes motion sensing device. In some embodiments, the first sensing structure 106a is disposed over or aligned with the first cavity 105. In some embodiments, the first sensing structure 106a is movable within the first cavity 105 and relative to the first substrate 101, the IMD layer 102 or the dielectric layer 104.

In some embodiments, the third substrate 106 is vertically stacked over the first substrate 101. In some embodiments, the third substrate 106 is bonded over the first substrate 101 by direct bonding operations, fusion bonding operations or other suitable operations. In some embodiments, the third substrate 106 is bonded with the dielectric layer 104 by fusion bonding operations.

Figure 5C:
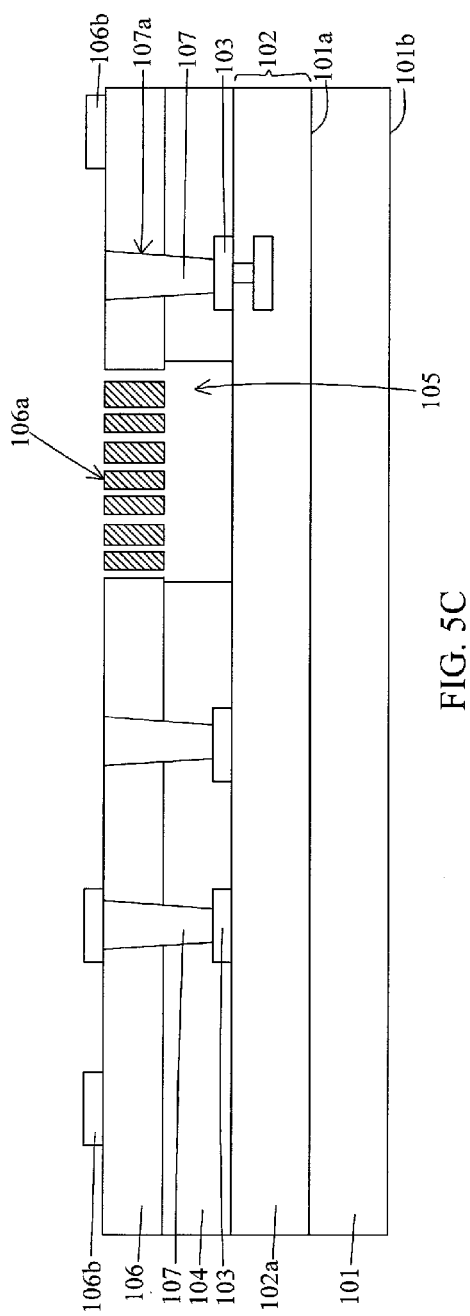

In operation 503, a plug 107 is formed as shown in FIG. 5C. In some embodiments, the plug 107 extends through the third substrate 106 and electrically connected with the conductive structure 103 disposed between the first substrate 101 and the third substrate 106. In some embodiments, the plug 107 is formed by removing a portion of the third substrate 106 and the dielectric layer 104 to form a first recess 107a by photolithography and etching operations or other suitable operations, and filing a conductive material within the first recess 107a by deposition, electroplating or other suitable operations. In some embodiments, the plug 107 is disposed over and electrically connected with the conductive structure 103.

In some embodiments, a first bond pad 106b is formed over the third substrate 106 or the plug 107. In some embodiments, the first bond pad 106b is disposed over and electrically connected with the plug 107. In some embodiments, the first bond pad 106b is formed by sputtering, electroplating or other suitable operations. In some embodiments the first bond pad 106b includes aluminum, copper or other suitable materials.

Figure 5D:
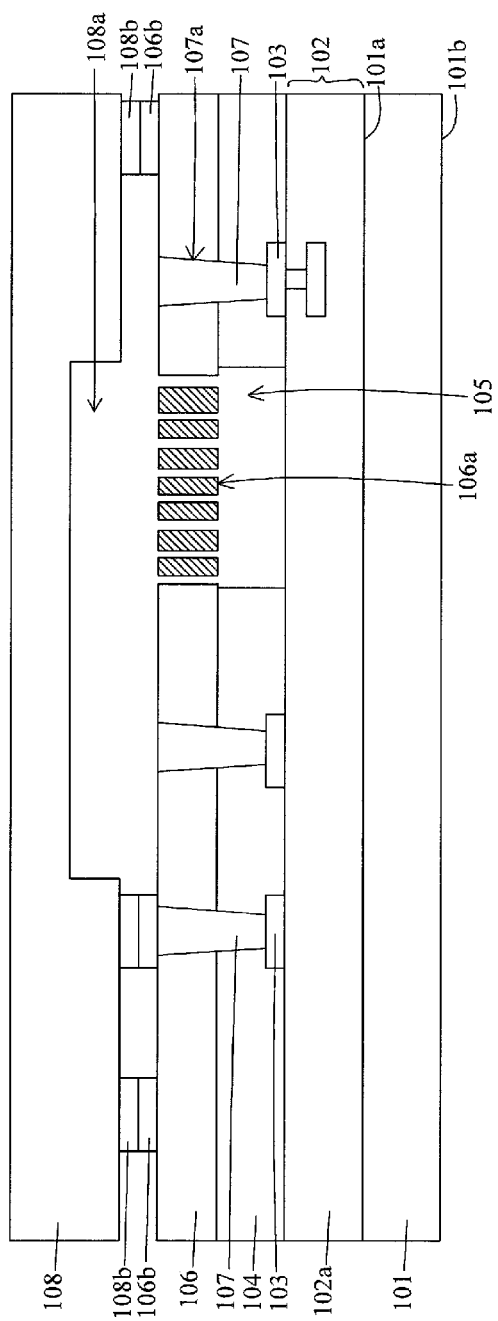

In operation 504, a second substrate 108 is disposed over the third substrate 106 as shown in FIG. 5D. In some embodiments, the second substrate 108 is vertically stacked over the third substrate 106 or the first substrate 101. In some embodiments, the second substrate 108 is a capping substrate or capping wafer for covering the first substrate 101 and the third substrate 106. In some embodiments, the second substrate 108 includes silicon or other suitable materials. In some embodiments, the second substrate 108 is bonded over the third substrate 106 by eutectic bonding operations or other suitable operations. In some embodiments, a second bond pad 108b is disposed over the second substrate 108 and opposite to the first bond pad 106b. In some embodiments, the second substrate 108 is bonded with the third substrate 106 by bonding the first bond pad 106b with the second bond pad 108b. In some embodiments, the second bond pad 108b includes germanium, silicon or other suitable materials. In some embodiments, the first bond pad 106b and the second bond pad 108b are bonded by eutectic bonding operations. In some embodiments, the second substrate 108 is eutectically bonded with the third substrate 106 under a high temperature of greater than about 400° C.

In some embodiments, a second cavity 108a extending within the second substrate 108 is formed. In some embodiments, the second cavity 108a is formed by removing a portion of the second substrate 108 by photolithography and etching operations or other suitable operations. In some embodiments, the second cavity 108a is formed over the first sensing structure 106a or the first cavity 105. In some embodiments, the first cavity 105 is cooperated with the second cavity 108a to become a cavity (the first cavity 105 and the second cavity 108a). The cavity (the first cavity 105 and the second cavity 108a) is disposed over the first substrate 101, and defined by the first substrate 101 and the third surface 108. In some embodiments, the first sensing structure 106a is surrounded by and movable within the cavity.

Figure 5E:
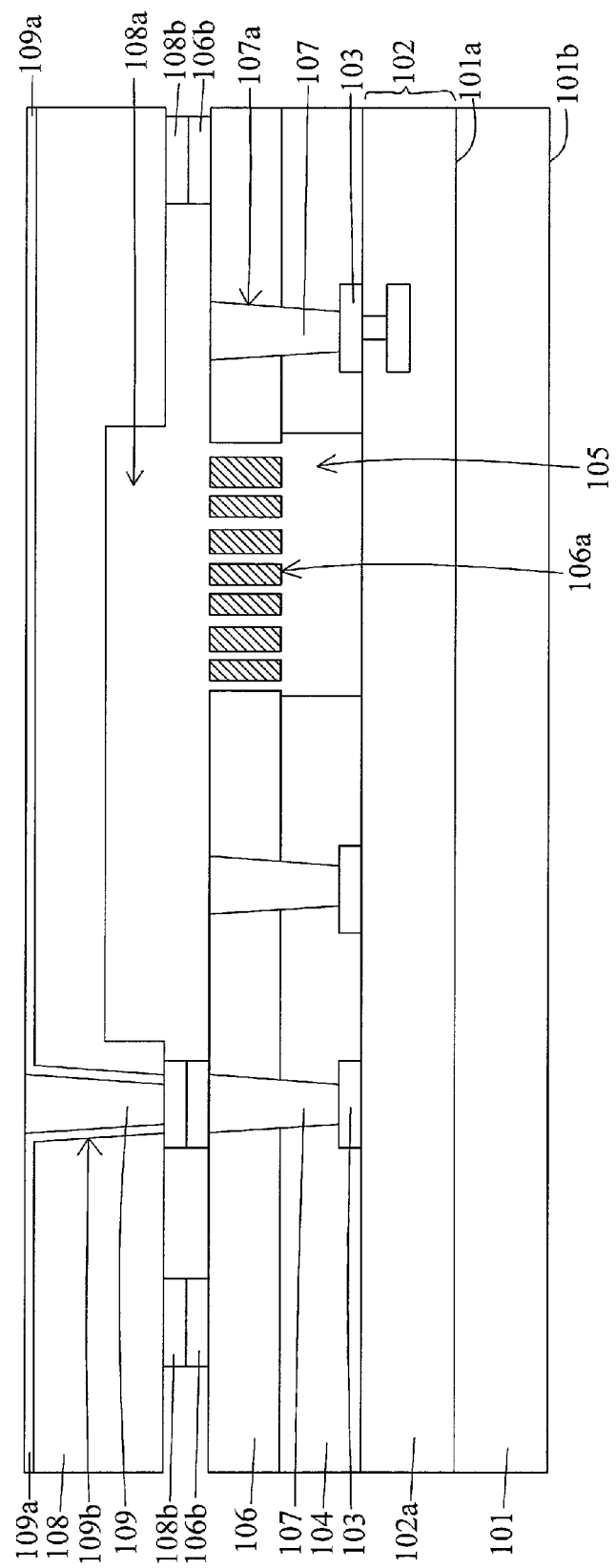

In operation 505, a via 109 is formed as shown in FIG. 5E. In some embodiments, the via 109 extends through the second substrate 108 and electrically connected with the plug 107. In some embodiments, the via 109 is formed by removing a portion of the second substrate 108 to form a second recess 109b by photolithography and etching operations or other suitable operations, and filing a conductive material or semiconductive material within the second recess 109b by deposition, electroplating or other suitable operations. In some embodiments, the second recess 109b is filled by a metal such as copper to form the via 109 as a copper pillar. In some embodiments, the second recess 109b is filled by a semiconductive material such as silicon, polysilicon, etc. to form the via 109 as a silicon pillar. In some embodiments, the via 109 is disposed over and electrically connected with the plug 107, the second bond pad 108b or the first bond pad 106b. In some embodiments, a first isolation layer 109a is disposed over the second substrate 108 and a sidewall of the second recess 109b after forming the second recess 109b. In some embodiments, the first isolation layer 109a is disposed by CVD operations or other suitable operations. In some embodiments, the via 109 is surrounded by the first isolation layer 109a. In some embodiments, the first isolation layer 109a is disposed between the via 109 and the second substrate 108.

Figure 5F:
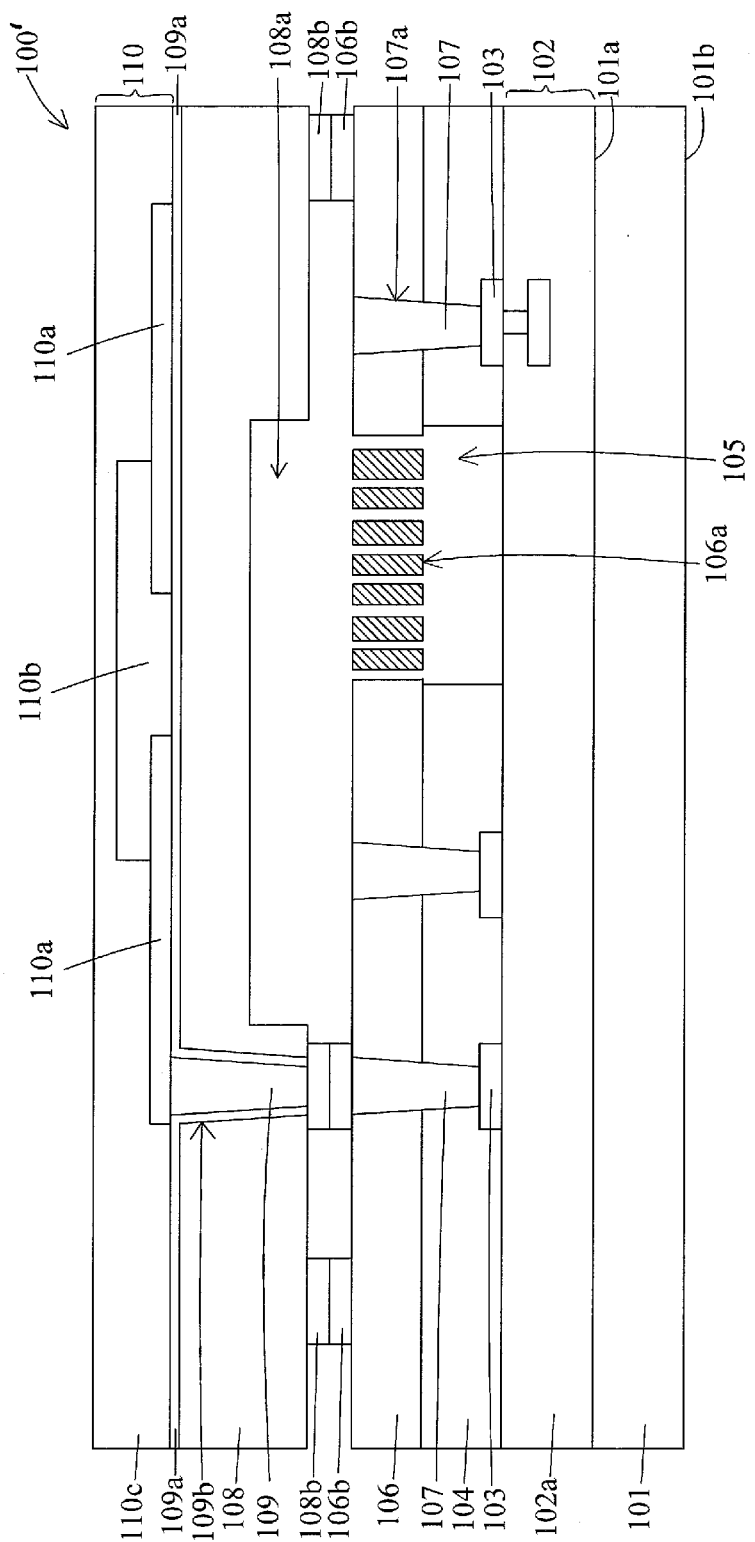

In operation 506, a second sensing structure 110 is formed over the second substrate 108 as shown in FIG. 5F. In some embodiments, the second sensing structure 110 is configured for sensing or detecting a magnetic field. In some embodiments, the second sensing structure 110 is a magnetic field sensor, magnetic sensor, one or more axes magnetic sensor, magnetometer, geomagnetic sensor, etc.

In some embodiments, an interconnect structure 110a is formed and disposed over the second substrate 108 and electrically connected with the via 109. In some embodiments, the interconnect structure 110a is patterned and formed over the first isolation layer 109a or the second substrate 108. In some embodiments, the interconnect structure 110a is formed by disposing a conductive material over the second substrate 108 and then patterning the conductive material to become the interconnect structure 110a. The conductive material is disposed by electroplating, sputtering, or other suitable operations. The conductive material is patterned by photolithography, etching or other suitable operations. In some embodiments, the interconnect structure 110a is electrically connected with the via 109.

In some embodiments, a sensing material 110b is formed and disposed over the second substrate 108. In some embodiments, the sensing material 110b at least partially covers the interconnect structure 110a. In some embodiments, the sensing material 110b is configured for sensing a magnetic field. In some embodiments, the sensing material 110b is a magnetic sensing material. In some embodiments, the sensing material 110b is disposed over the second substrate 108 and a portion of the interconnect structure 110a by deposition, photolithography, etching or other suitable operations.

In some embodiments, the second isolation layer 110c is disposed over the second substrate 108 and covers the interconnect structure 110a and the sensing material 110b. In some embodiments, the second isolation layer 110c is configured to protect the interconnect structure 110a and the sensing material 110b. In some embodiments, the second isolation layer 110c is formed by CVD or other suitable operations.

In some embodiments, the semiconductor structure 100' is formed as shown in FIG. 5F which has similar configuration as described above and illustrated in FIG. 1A. The first substrate 101, the third substrate 106 and the second substrate 108 are vertically stacked over each other, and thus a geometric size or form factor of the semiconductor structure 100 is minimized. Further, as the second sensing structure 110 is formed after the bonding of the second substrate 108 with the third substrate 106 under a high temperature, the sensing material 110b which is easily deteriorated by heat or high temperature would not be affected or damaged during the bonding operations under high temperature.

In some embodiments, a semiconductor structure 200' is formed by a method 600. The method 600 includes a number of operations and the description and illustration are not deemed as a limitation as the sequence of the operations.

Figure 6:
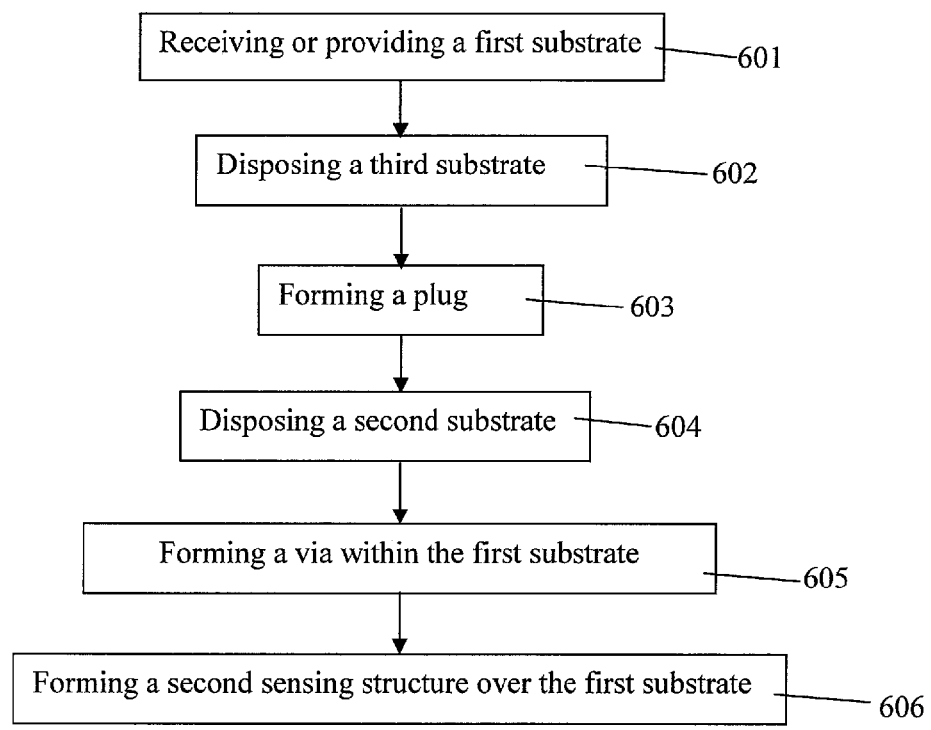
FIG. 6 is a flow diagram of a method of manufacturing a semiconductor structure in accordance with some embodiments of the present disclosure.

FIG. 6 is an embodiment of a method 600 of manufacturing a semiconductor structure 200'. The method 600 includes a number of operations (601, 602, 603, 604, 605 and 606).

Figure 6A:
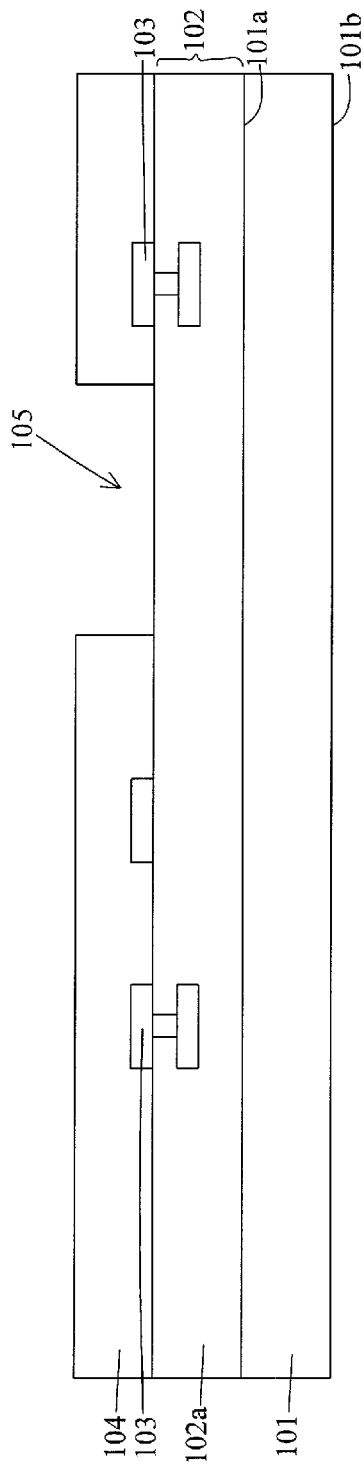
FIGS. 6A-6F are schematic views of manufacturing a semiconductor structure by a method of FIG. 6 in accordance with some embodiments of the present disclosure.
Figure 6B:
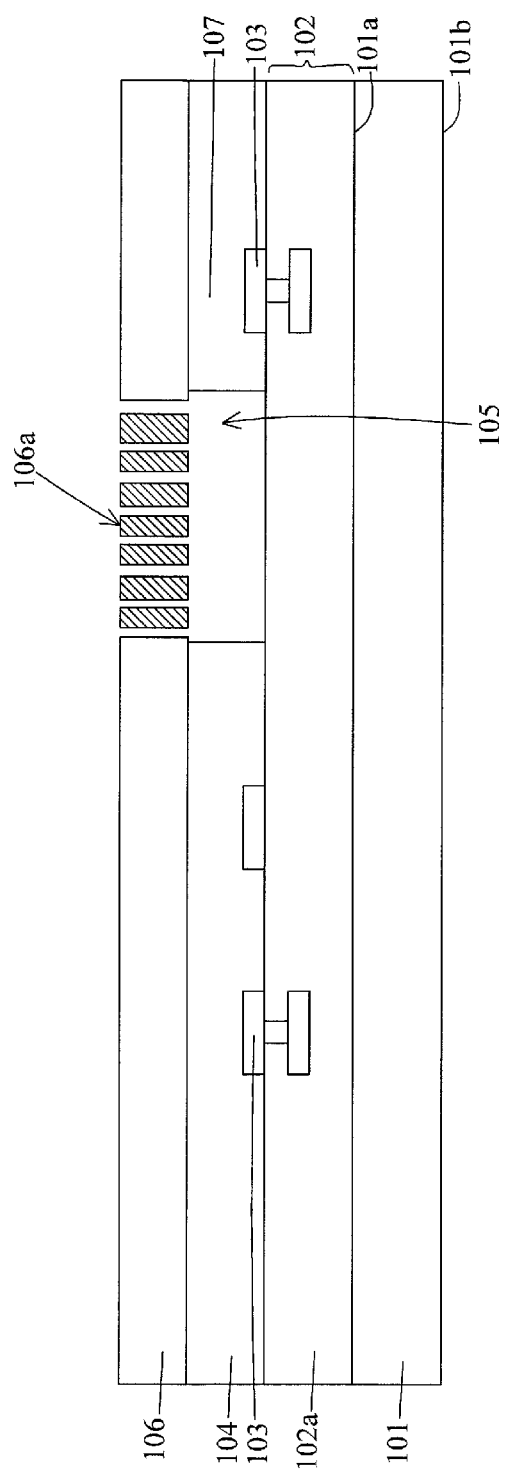
Figure 6C:
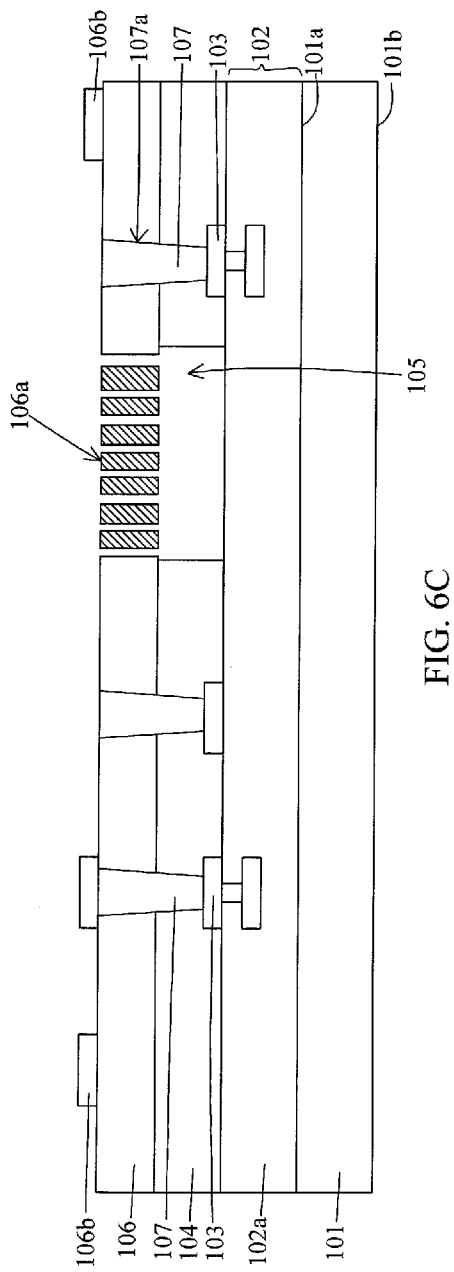
Figure 6D:
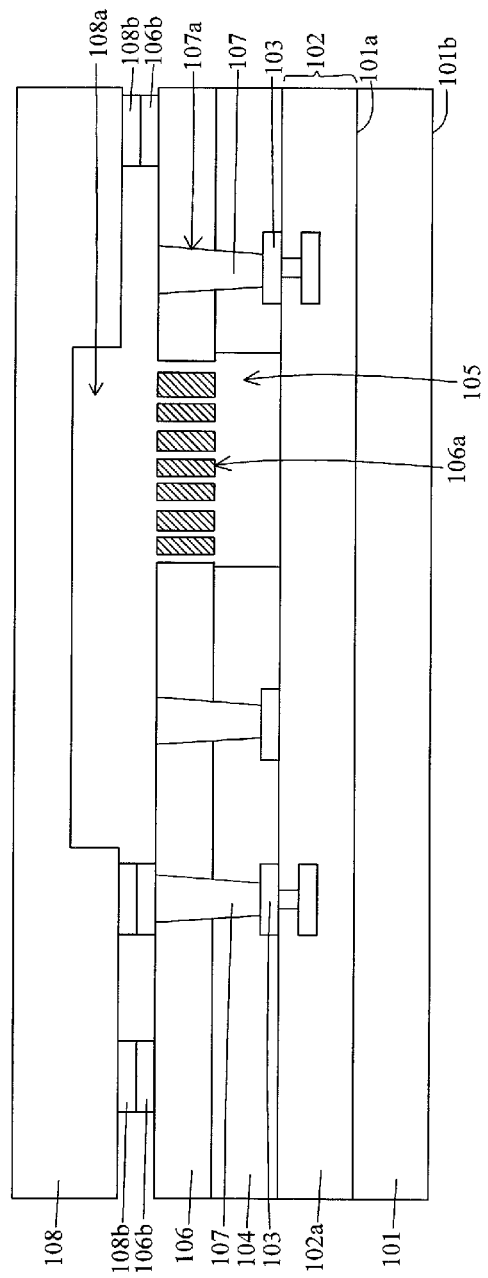

In operation 601, a first substrate 101 is received or provided as shown in FIG. 6A. The operation 601 is similar to the operation 501 in FIG. 5A. In operation 602, a third substrate 106 is disposed over the first substrate 101 as shown in FIG. 6B. The operation 602 is similar to the operation 502 in FIG. 5B. In operation 603, a plug 107 is formed as shown in FIG. 6C. The operation 603 is similar to the operation 503 in FIG. 5C. In operation 604, a second substrate 108 is disposed as shown in FIG. 6D. The operation 604 is similar to the operation 504 in FIG. 5D.

Figure 6E:
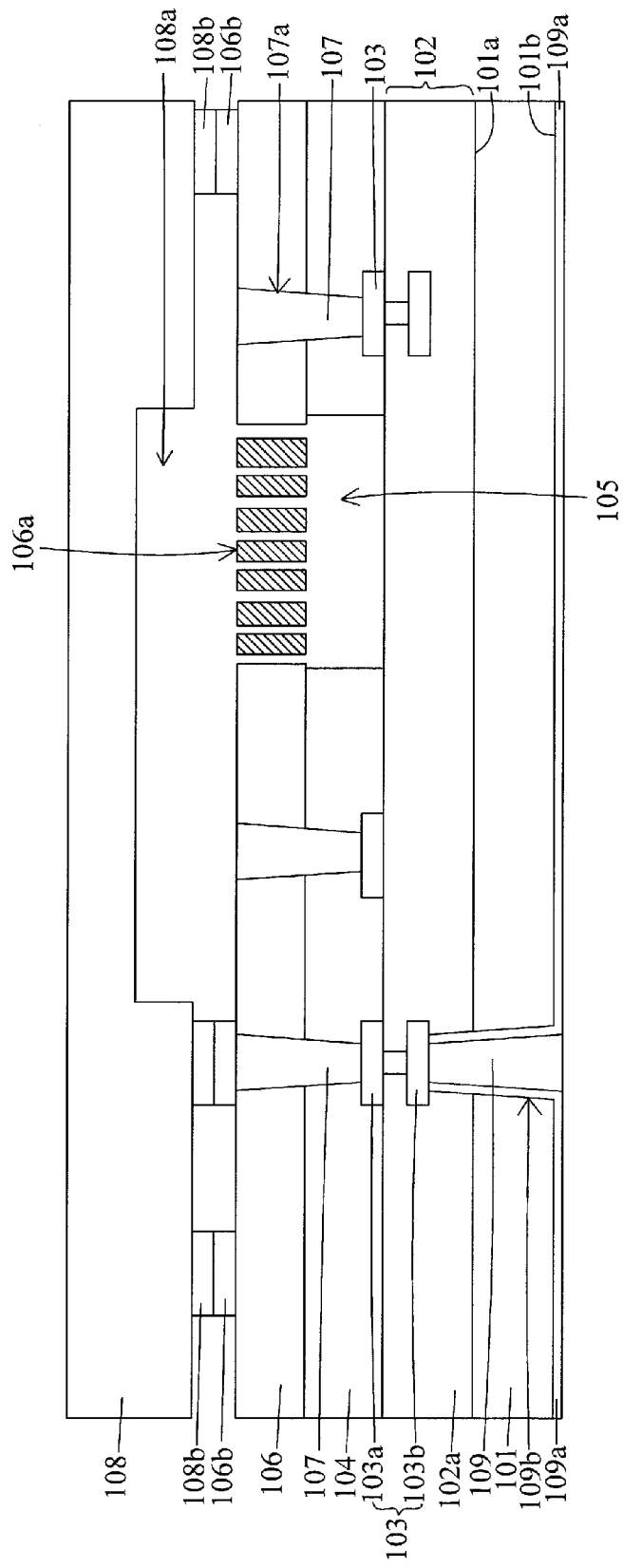

In operation 605, a via 109 is formed as shown in FIG. 6E. In some embodiments, the via 109 extends through the first substrate 101 to the IMD layer 102 and electrically connected with the conductive structure 103 and the plug 107. In some embodiments, the via 109 is formed by removing a portion of the first substrate 101 and the IMD layer 102 to form a second recess 109b by photolithography and etching operations or other suitable operations, and filing a conductive material or semiconductive material within the second recess 109b by deposition, electroplating or other suitable operations. In some embodiments, the second recess 109b is filled by a metal such as copper to form the via 109 as a copper pillar. In some embodiments, the second recess 109b is filled by a semiconductive material such as silicon, polysilicon, etc. to form the via 109 as a silicon pillar. In some embodiments, the via 109 is disposed over and electrically connected with the plug 107, the second bond pad 108b or the first bond pad 106b. In some embodiments, the via 109 is coupled with a bottom portion 103b of the conductive structure 103. In some embodiments, a first isolation layer 109a is disposed over the first substrate 101 and a sidewall of the second recess 109b after forming the second recess 109b. In some embodiments, the first isolation layer 109a is disposed by CVD operations or other suitable operations. In some embodiments, the via 109 is surrounded by the first isolation layer 109. In some embodiments, the first isolation layer 109 is disposed between the via 109 and the first substrate 101.

Figure 6F:
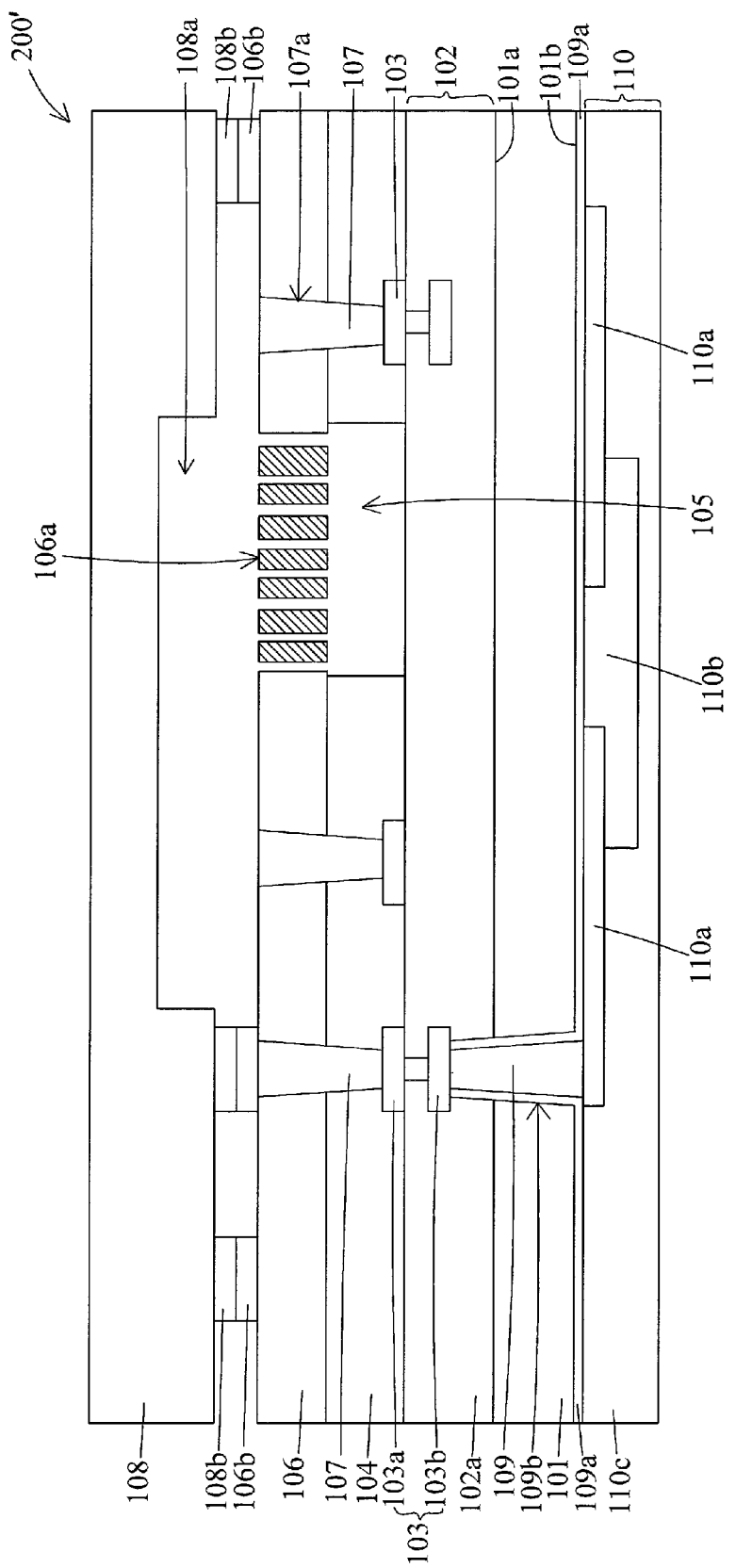

In operation 606, a second sensing structure 110 is formed over the first substrate 101 as shown in FIG. 6F. In some embodiments, the second sensing structure 110 is configured for sensing or detecting a magnetic field. In some embodiments, the second sensing structure 110 is a magnetic field sensor, magnetic sensor, three or more axes magnetic sensor, magnetometer, geomagnetic sensor, etc. In some embodiments, an interconnect structure 110a is formed and disposed over the first substrate 101 and electrically connected with the via 109. In some embodiments, the interconnect structure 110a is patterned and formed over the first isolation layer 109a or the first substrate 101. In some embodiments, the interconnect structure 110a is formed by disposing a conductive material over the first substrate 101 and then patterning the conductive material to become the interconnect structure 110a. The conductive material is disposed by electroplating, sputtering, or other suitable operations. The conductive material is patterned by photolithography, etching or other suitable operations. In some embodiments, the interconnect structure 110a is electrically connected with the via 109.

In some embodiments, a sensing material 110b is formed and disposed over the first substrate 101. In some embodiments, the sensing material 110b at least partially covers the interconnect structure 110a. In some embodiments, the sensing material 110b is configured for sensing a magnetic field. In some embodiments, the sensing material 110b is a magnetic sensing material. In some embodiments, the sensing material 110b is disposed over the first substrate 101 and a portion of the interconnect structure 110a by deposition, photolithography, etching or other suitable operations.

In some embodiments, the second isolation layer 110c is disposed over the first substrate 101 and covers the interconnect structure 110a and the sensing material 110b. In some embodiments, the second isolation layer 110c is configured to protect the interconnect structure 110a and the sensing material 110b. In some embodiments, the second isolation layer 110c is formed by CVD or other suitable operations. In some embodiments, the semiconductor structure 200 is formed as shown in FIG. 6F which has similar configuration as described above and illustrated in FIG. 2.

Figure 7:
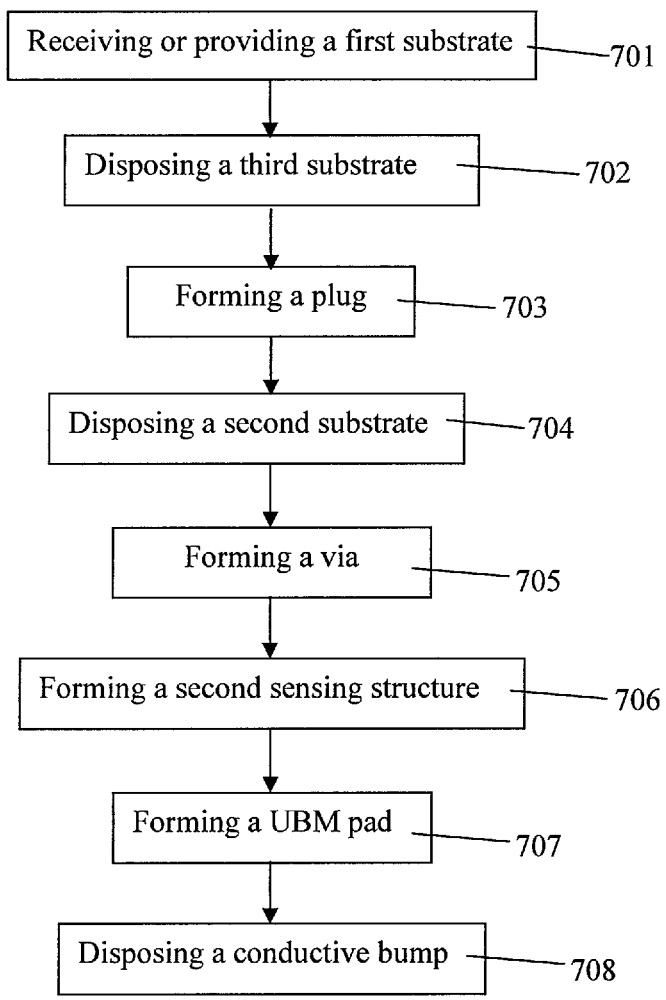
FIG. 7 is a flow diagram of a method of manufacturing a semiconductor structure in accordance with some embodiments of the present disclosure.

In some embodiments, a semiconductor structure 300 is formed by a method 700. The method 700 includes a number of operations and the description and illustration are not deemed as a limitation as the sequence of the operations. FIG. 7 is an embodiment of a method 700 of manufacturing a semiconductor structure 300. The method 700 includes a number of operations (701, 702, 703, 704, 705, 706, 707 and 708).

Figure 7A:
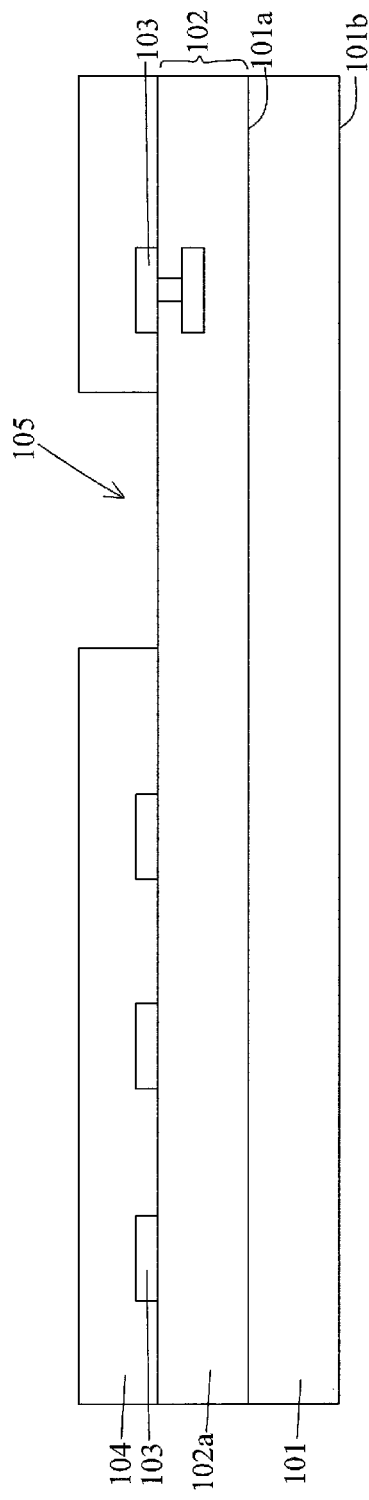
FIGS. 7A-7H are schematic views of manufacturing a semiconductor structure by a method of FIG. 7 in accordance with some embodiments of the present disclosure.
Figure 7B:
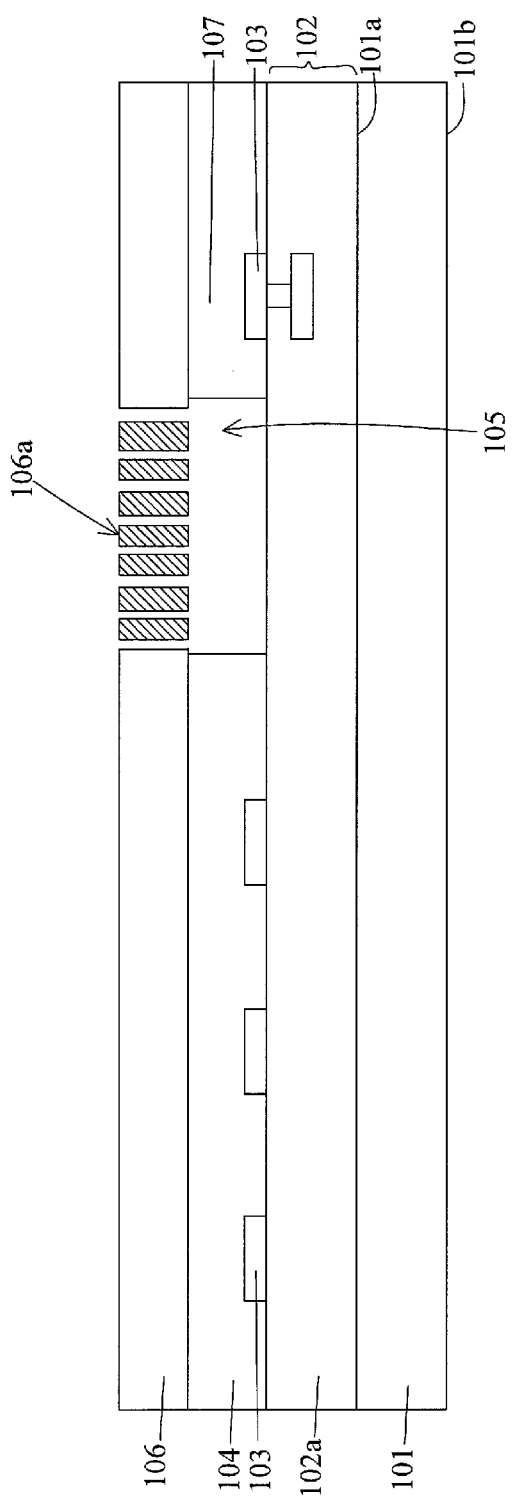
Figure 7C:
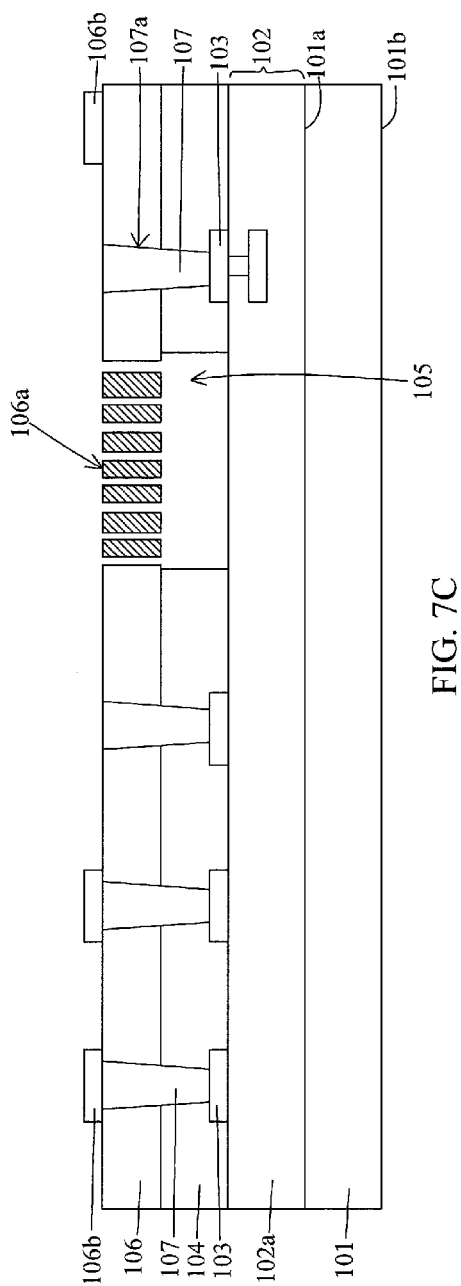
Figure 7D:
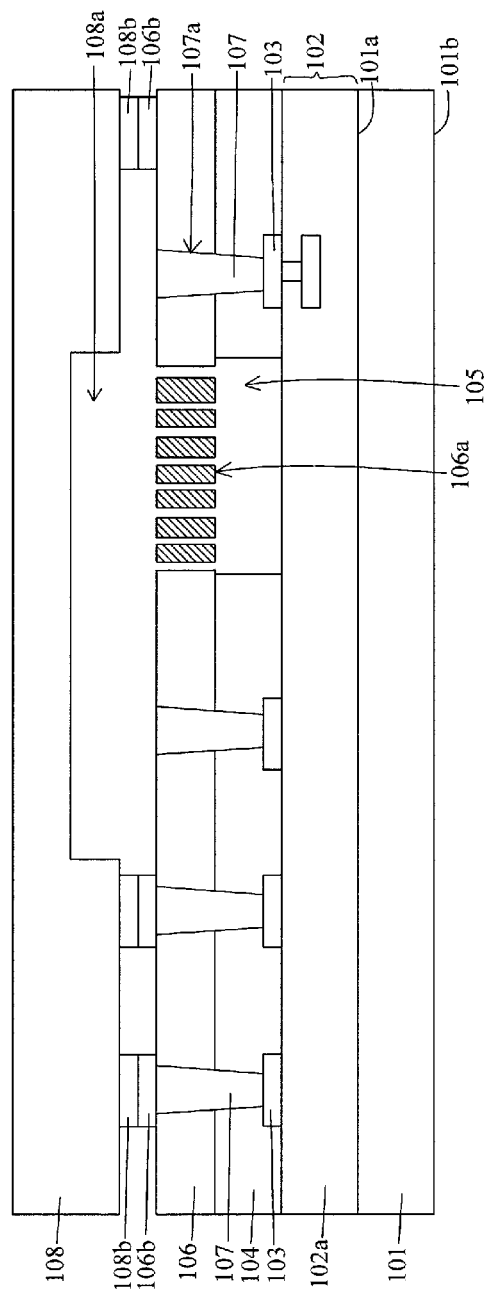
Figure 7E:
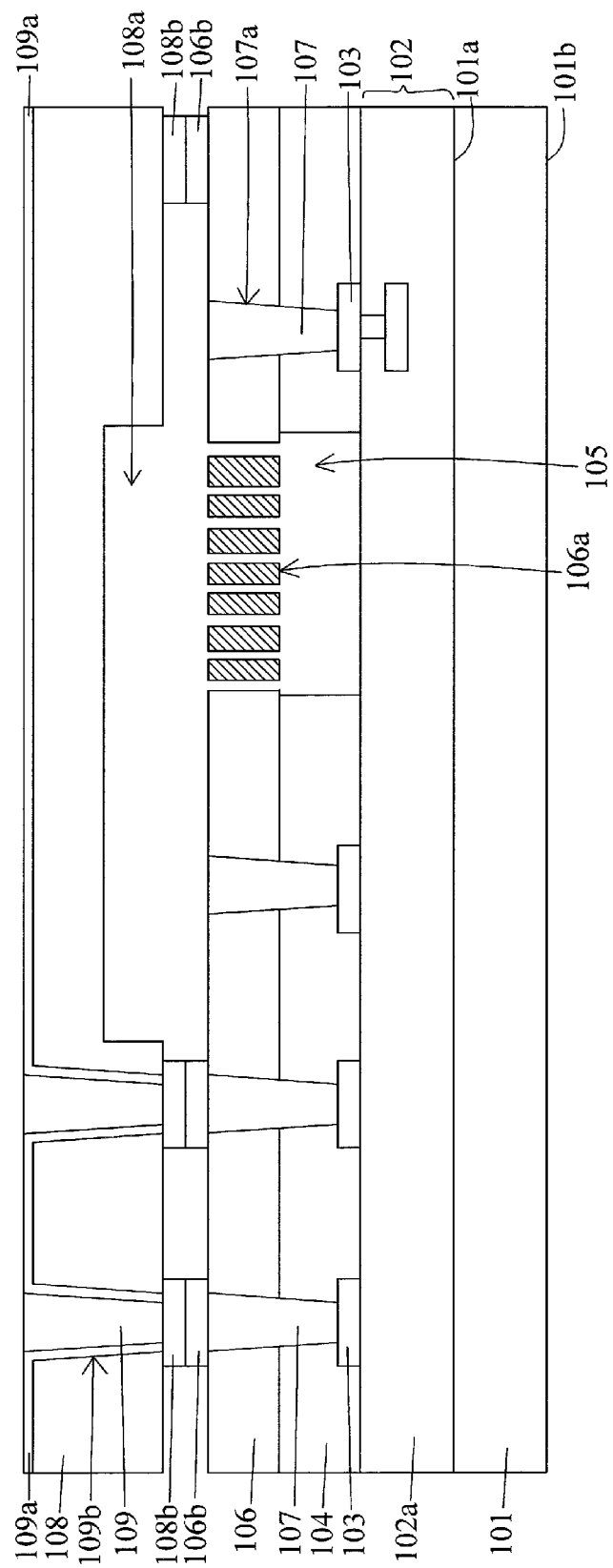
Figure 7F:
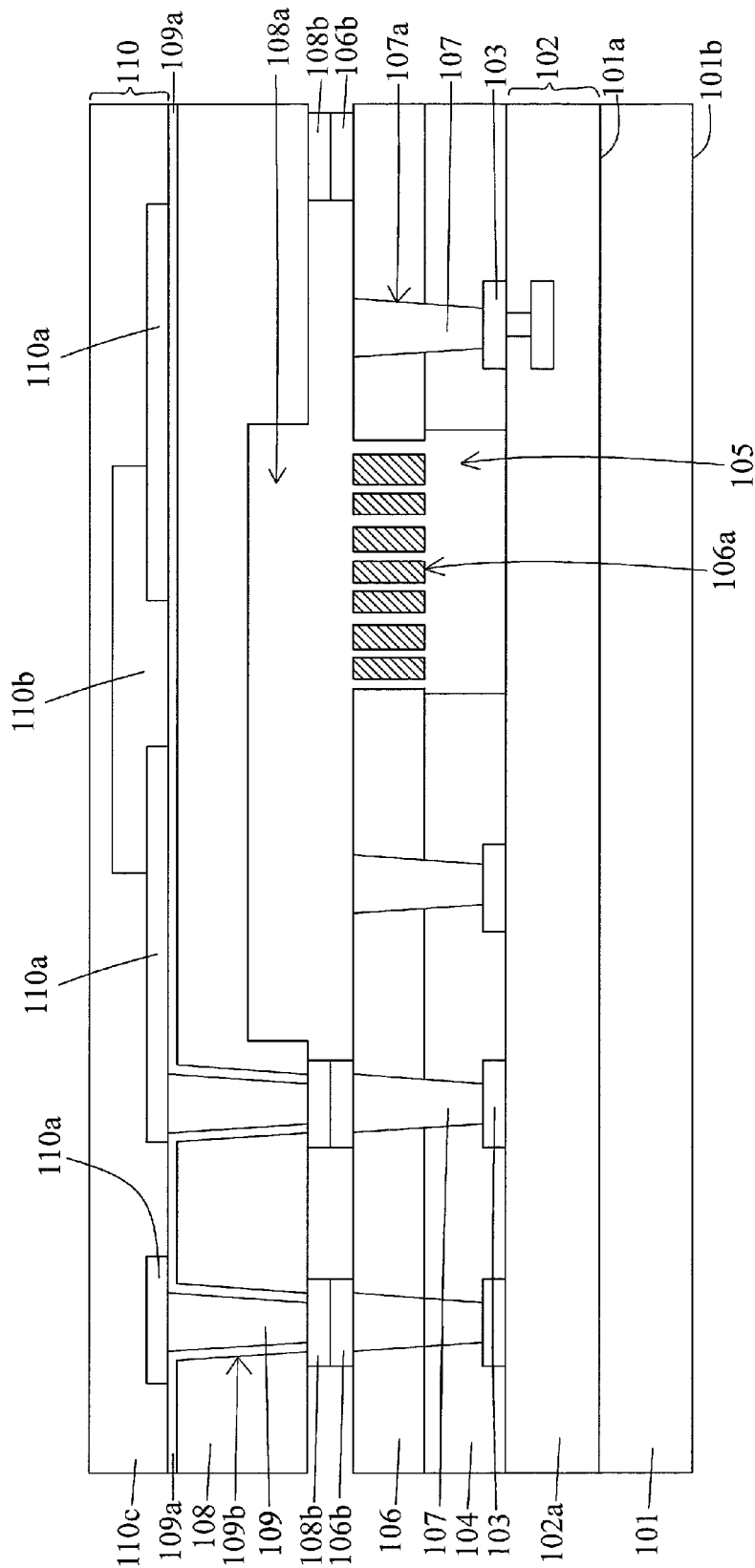

In operation 701, a first substrate 101 is received or provided as shown in FIG. 7A. The operation 701 is similar to the operation 501 in FIG. 5A. In operation 702, a third substrate 106 is disposed over the first substrate 101 as shown in FIG. 7B. The operation 702 is similar to the operation 502 in FIG. 5B. In operation 703, a plug 107 is formed as shown in FIG. 7C. The operation 703 is similar to the operation 503 in FIG. 5C. In operation 704, a second substrate 108 is disposed as shown in FIG. 7D. The operation 704 is similar to the operation 504 in FIG. 5D. In operation 705, a via 109 is formed as shown in FIG. 7E. The operation 705 is similar to the operation 505 in FIG. 5E. In operation 706, a second sensing structure 110 is formed over the second substrate 108 as shown in FIG. 7F. The operation 706 is similar to the operation 506 in FIG. 5F.

Figure 7G:
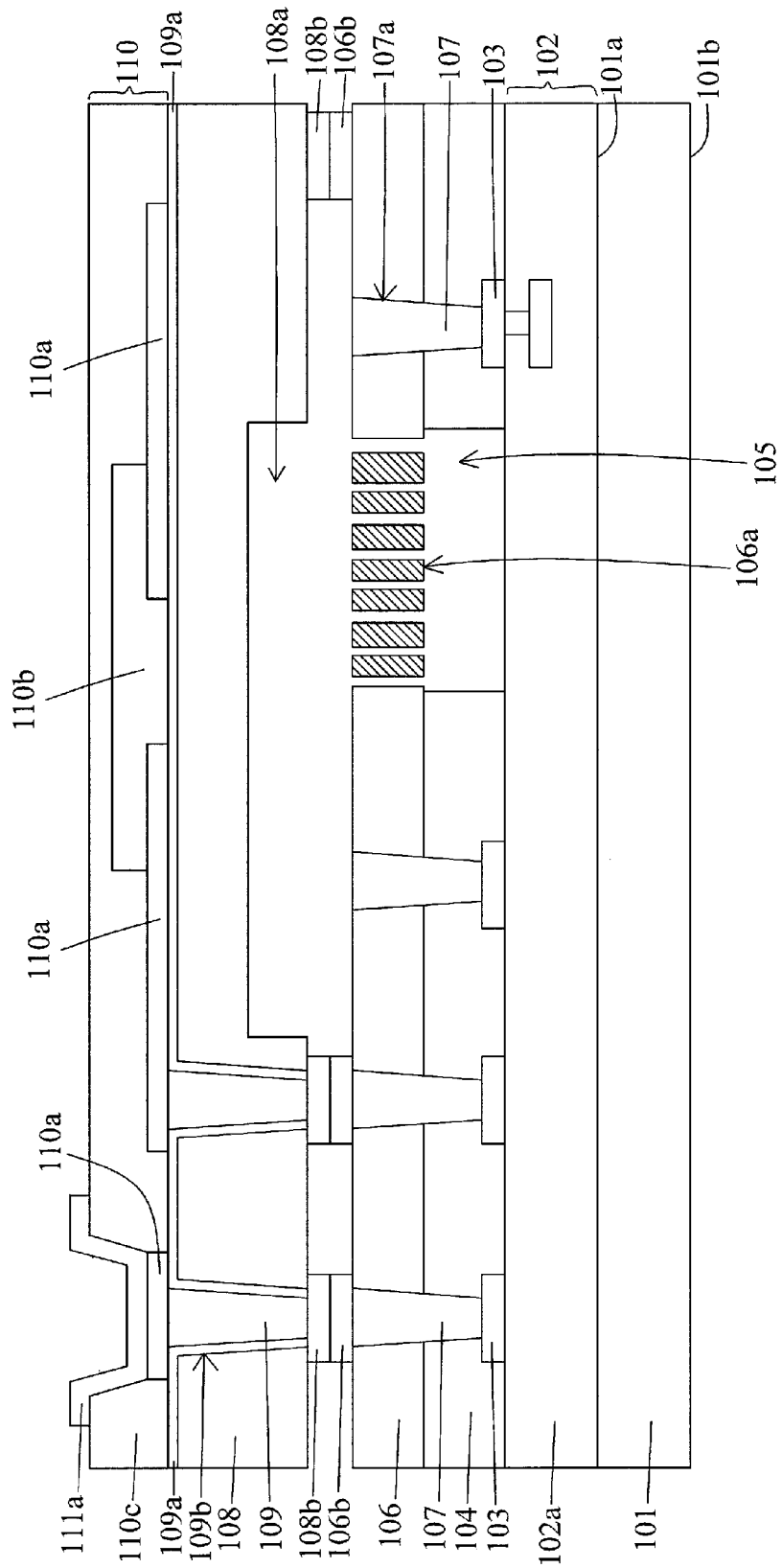

In operation 707, a UBM pad 111a is formed over the second substrate 108 or a portion of the interconnect structure 110a as shown in FIG. 7G. In some embodiments, the UBM pad 111a is electrically connected with the portion of the interconnect structure 110a and the via 109. In some embodiments, the UBM pad 111a is formed by removing a portion of the second isolation layer 110c by etching or other suitable operations, and disposing a conductive material by electroplating, sputtering or other suitable operations. In some embodiments, the UBM pad 111a is formed by patterning the conductive material by photolithography and etching operations or other suitable operations.

Figure 7H:
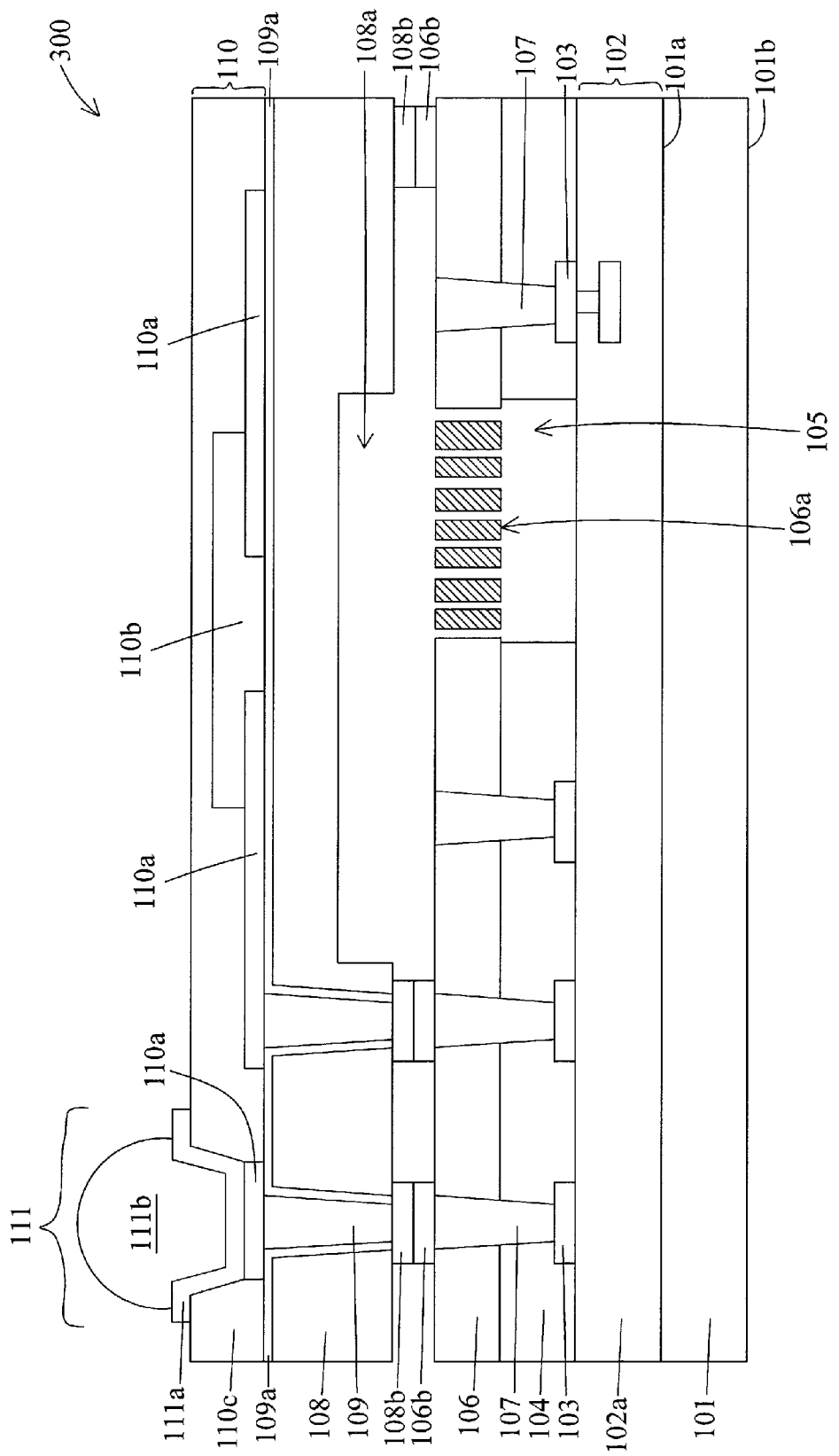

In operation 708, a conductive bump 111b is disposed over the UBM pad 111a as shown in FIG. 7H. In some embodiments, the conductive bump 111b is formed by ball mounting operations, stencil printing (pasting soldering material over a stencil) operations or other suitable operations. In some embodiments, the conductive bump 111b is reflowed or thermally cured after disposing over the UBM pad 111a. In some embodiments, the conductive bump 111b is electrically connected with the UBM pad 111a, the interconnect structure 110a and the via 109. In some embodiments, the semiconductor structure 300 is formed as shown in FIG. 7H which has similar configuration as described above and illustrated in FIG. 3.

In some embodiments, a semiconductor structure 400 is formed by a method 800. The method 800 includes a number of operations and the description and illustration are not deemed as a limitation as the sequence of the operations.

Figure 8:
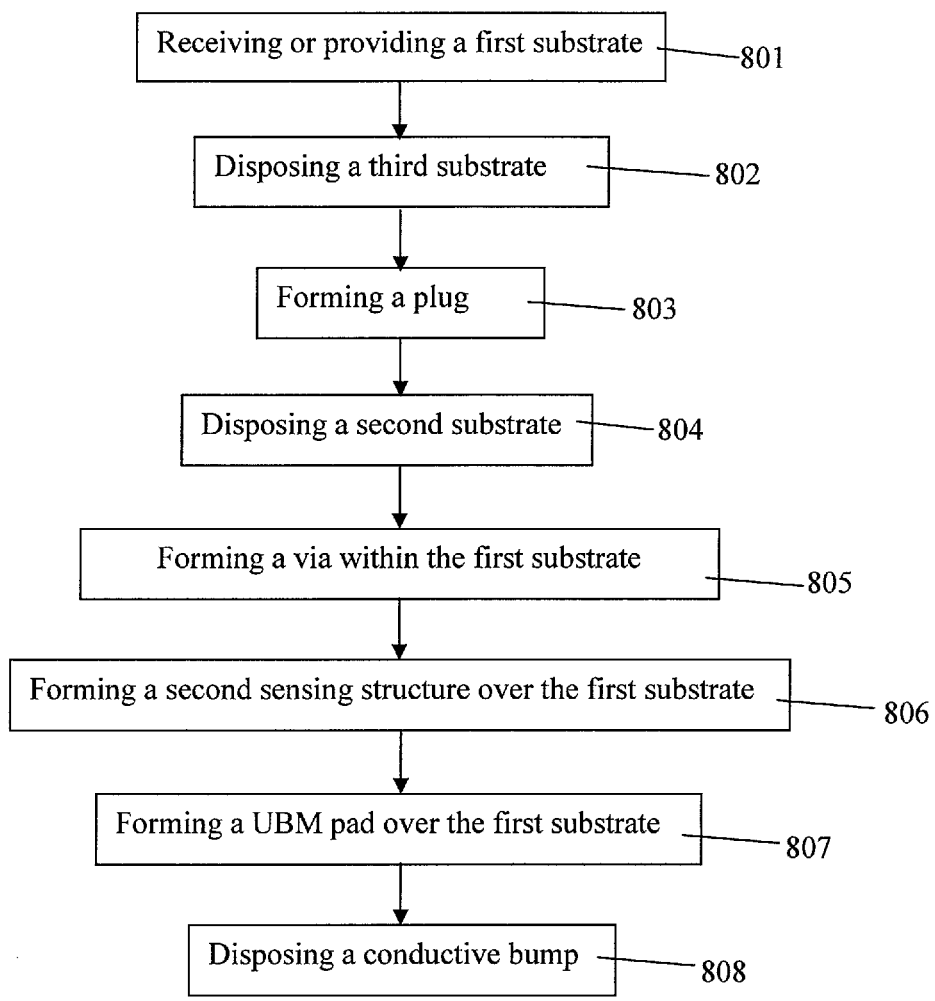
FIG. 8 is a flow diagram of a method of manufacturing a semiconductor structure in accordance with some embodiments of the present disclosure.

FIG. 8 is an embodiment of a method 800 of manufacturing a semiconductor structure 400. The method 800 includes a number of operations (801, 802, 803, 804, 805, 806, 807 and 808).

Figure 8A:
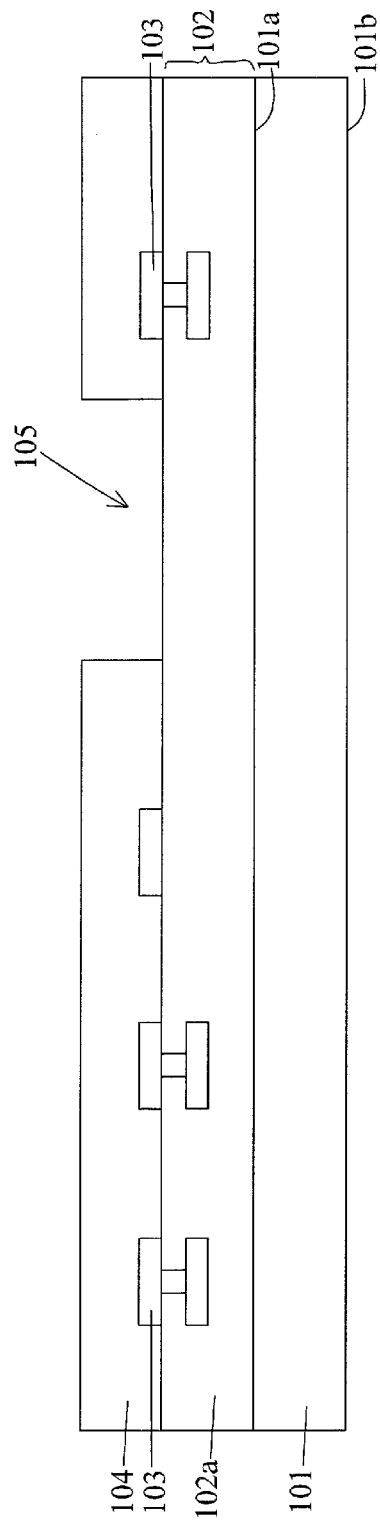
FIGS. 8A-8H are schematic views of manufacturing a semiconductor structure by a method of FIG. 8 in accordance with some embodiments of the present disclosure.
Figure 8B:
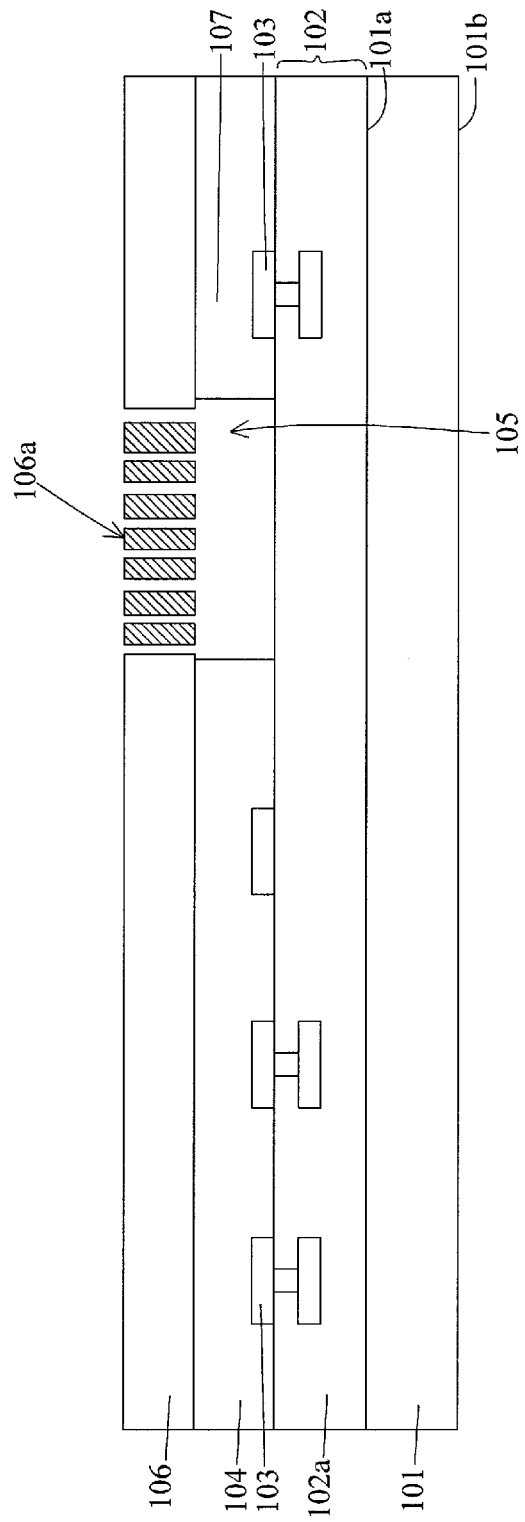
Figure 8C:
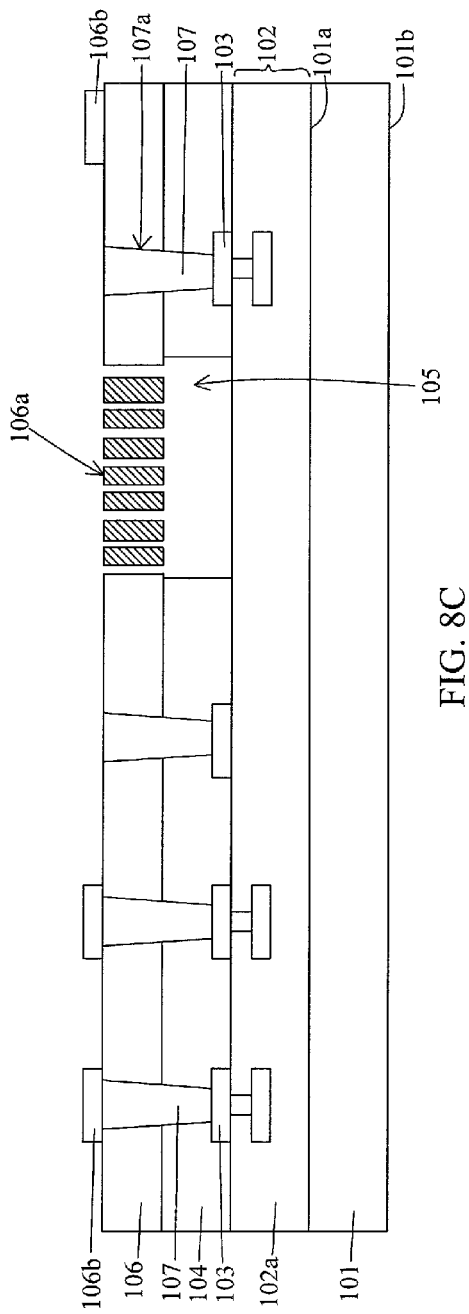
Figure 8D:
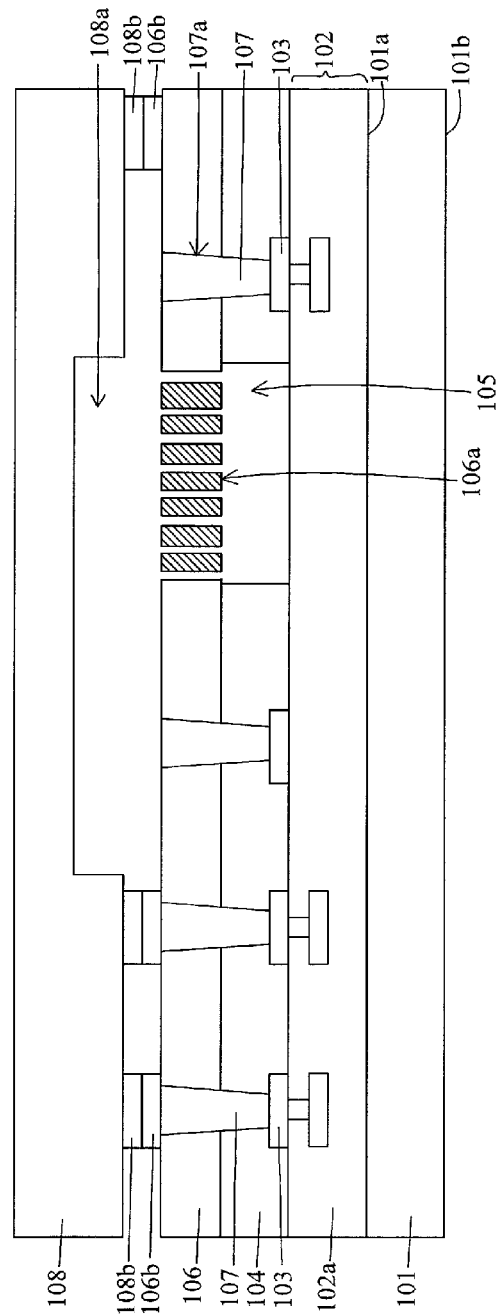
Figure 8E:
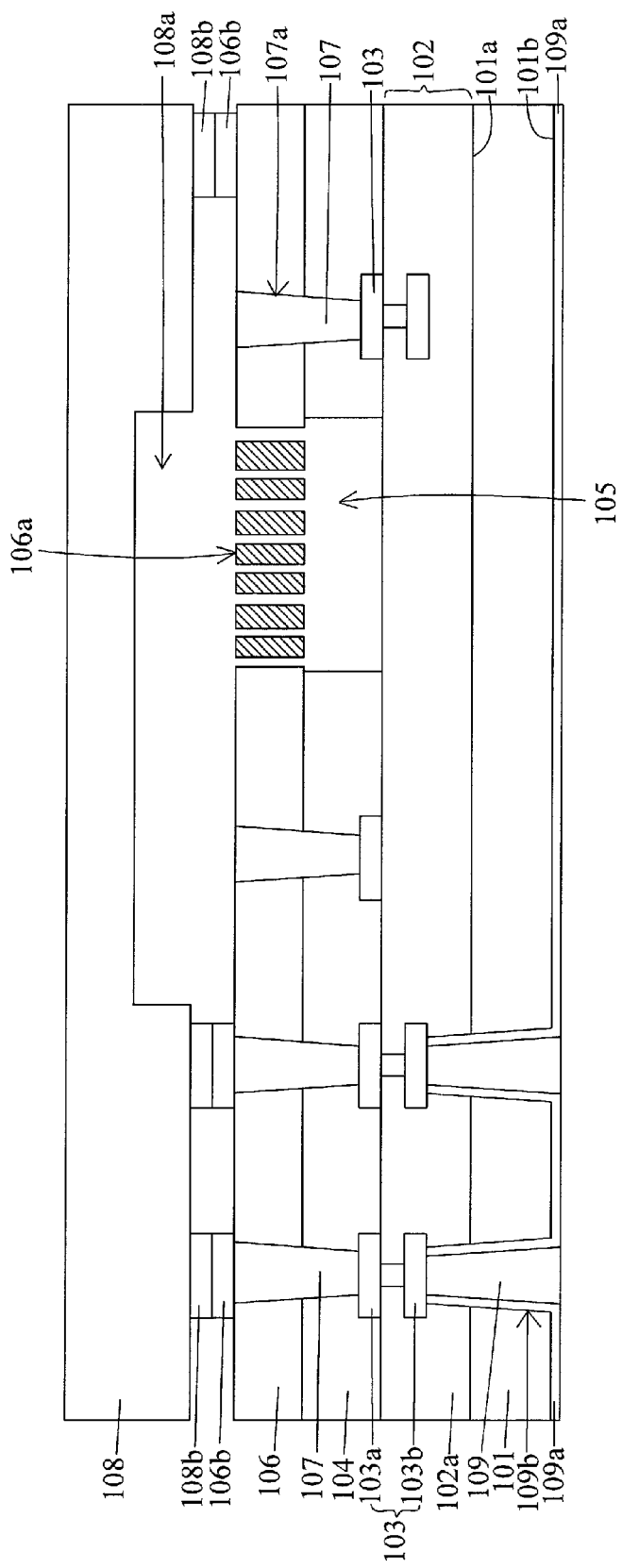
Figure 8F:
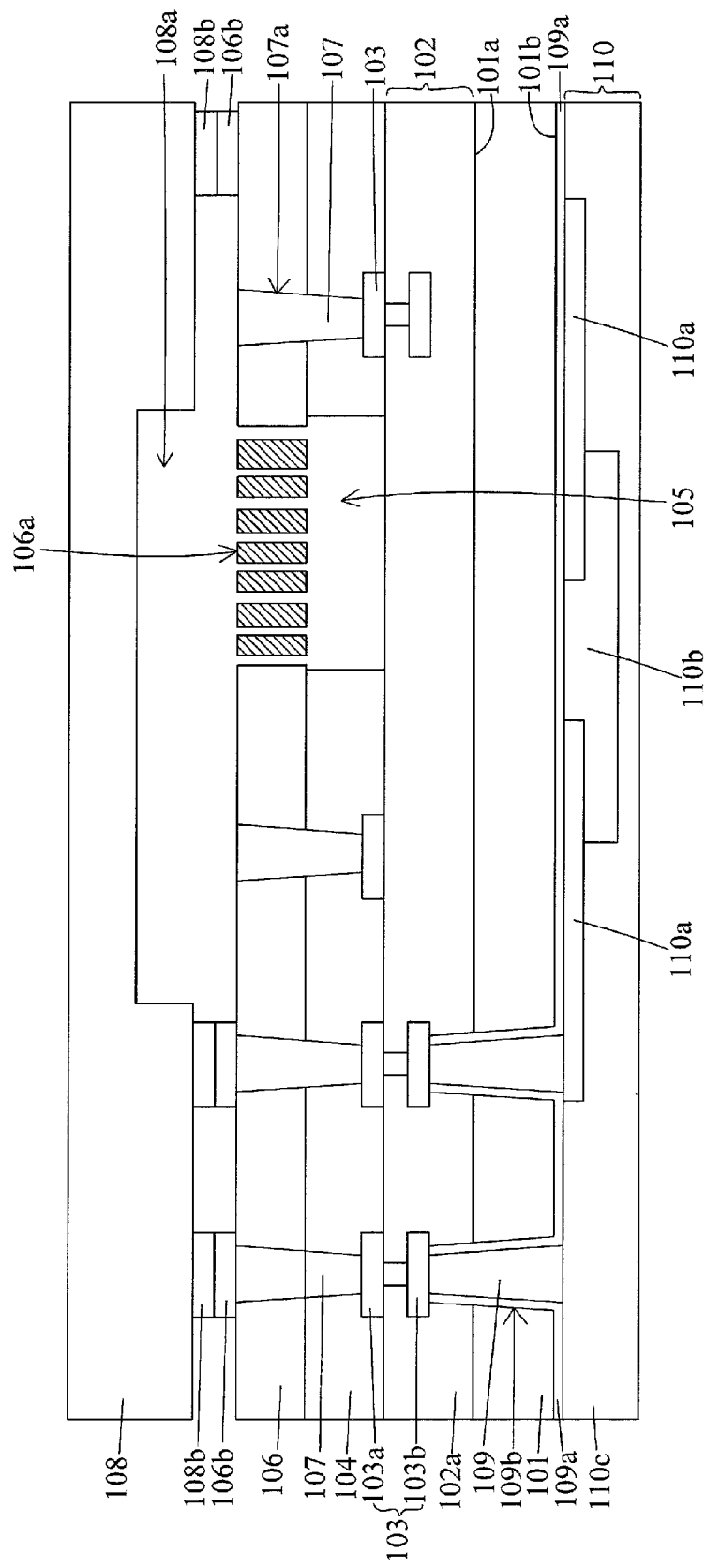

In operation 801, a first substrate 101 is received or provided as shown in FIG. 8A. The operation 801 is similar to the operation 601 in FIG. 6A. In operation 802, a third substrate 106 is disposed over the first substrate 101 as shown in FIG. 8B. The operation 802 is similar to the operation 602 in FIG. 6B. In operation 803, a plug 107 is formed as shown in FIG. 8C. The operation 803 is similar to the operation 603 in FIG. 5C. In operation 804, a second substrate 108 is disposed as shown in FIG. 8D. The operation 804 is similar to the operation 604 in FIG. 6D. In operation 805, a via 109 is formed within the first substrate 101 as shown in FIG. 8E. The operation 805 is similar to the operation 605 in FIG. 6E. In operation 806, a second sensing structure 110 is formed over the first substrate 101 as shown in FIG. 8F. The operation 806 is similar to the operation 606 in FIG. 6F.

Figure 8G:
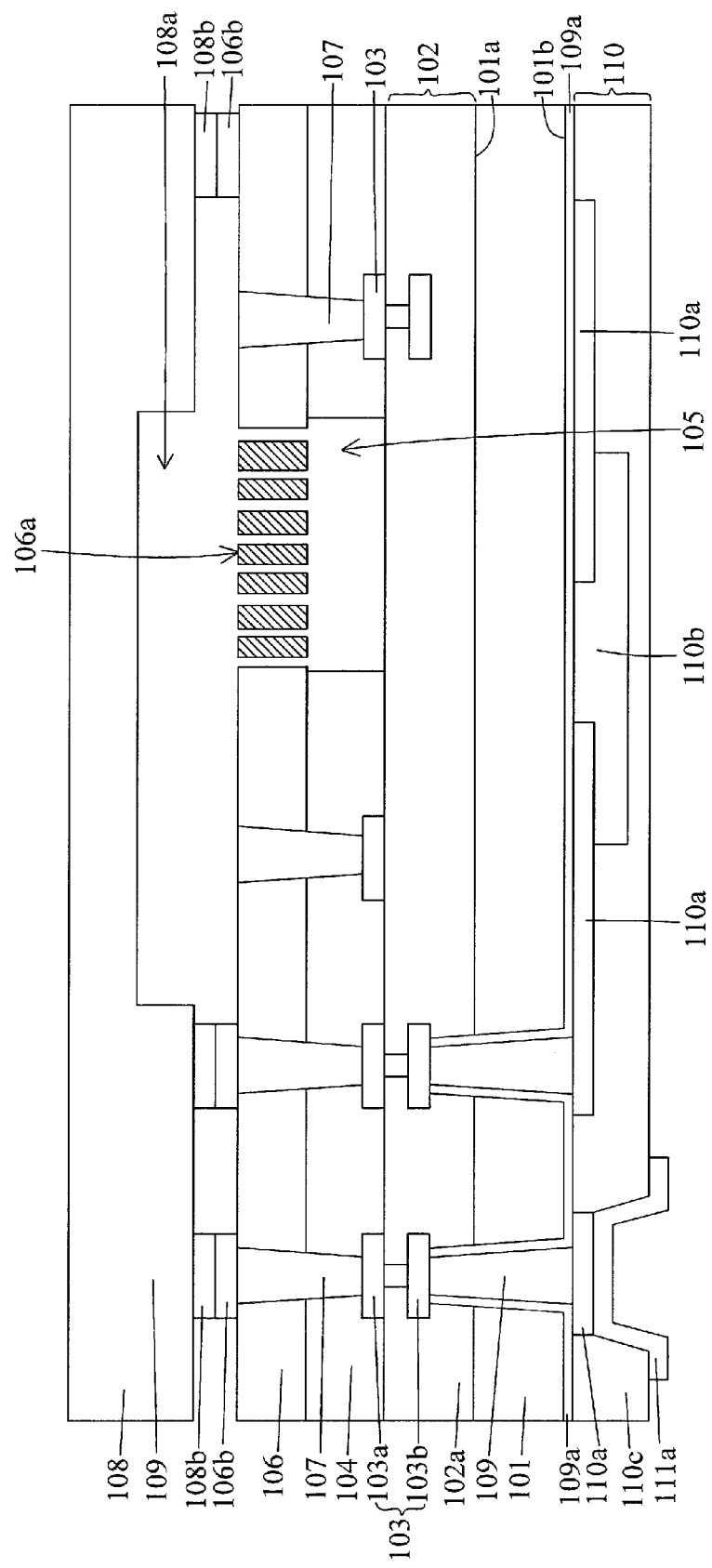

In operation 807, a UBM pad is formed over the first substrate 101 8 or a portion of the interconnect structure 110a as shown in FIG. 8G. In some embodiments, the UBM pad 111a is electrically connected with the portion of the interconnect structure 110a and the via 109. In some embodiments, the UBM pad 111a is formed by removing a portion of the second isolation layer 110c by etching or other suitable operations, and disposing a conductive material by electroplating, sputtering or other suitable operations. In some embodiments, the UBM pad 111a is formed by patterning the conductive material by photolithography and etching operations or other suitable operations.

Figure 8H:
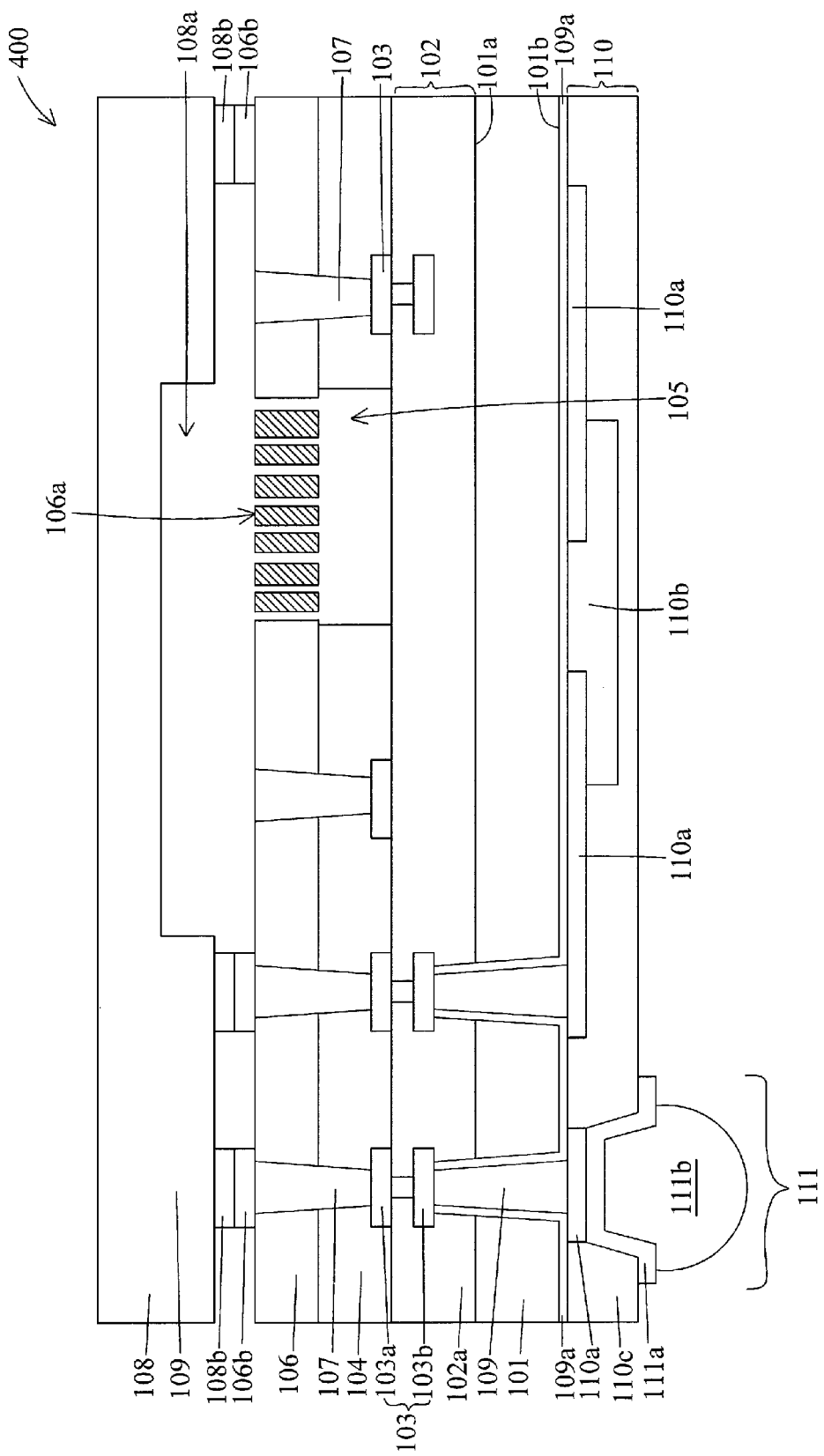

In operation 808, a conductive bump 111b is disposed over the UBM pad 111a as shown in FIG. 8H. In some embodiments, the operation 808 is similar to the operation 708 as shown in FIG. 7H. In some embodiments, the semiconductor structure 400 is formed as shown in FIG. 8H which has similar configuration as described above and illustrated in FIG. 4.

Figure 9:
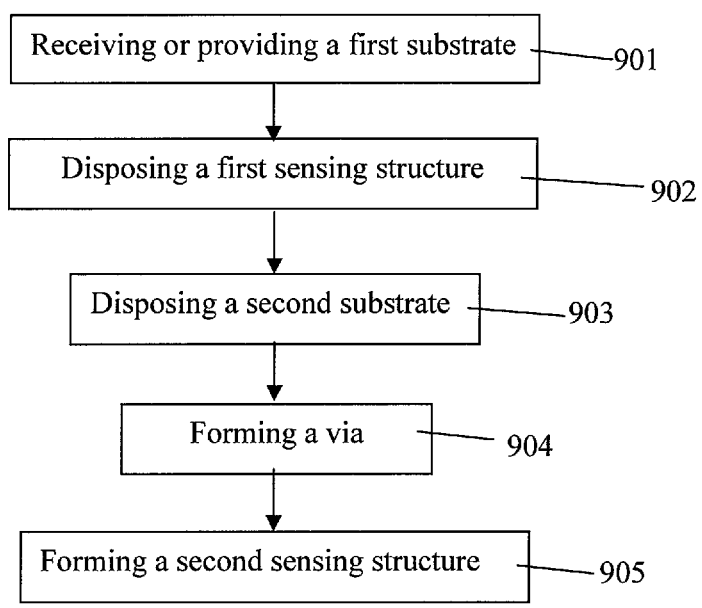
FIG. 9 is a flow diagram of a method of manufacturing a semiconductor structure in accordance with some embodiments of the present disclosure.

In some embodiments, a semiconductor structure 100 is formed by a method 900. The method 900 includes a number of operations and the description and illustration are not deemed as a limitation as the sequence of the operations. FIG. 9 is an embodiment of a method 900 of manufacturing a semiconductor structure 100. The method 900 includes a number of operations (901, 902, 903, 904 and 905).

Figure 9A:
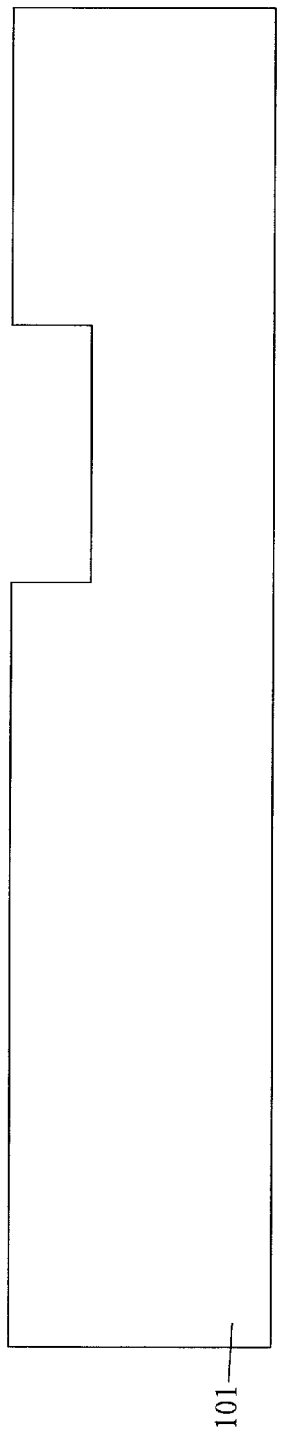

In operation 901, a first substrate 101 is received or provided as shown in FIG. 9A. In some embodiments, the first substrate 101 includes several circuitries and several active elements such as transistors etc. disposed over or in the first substrate 101. In some embodiments, the first substrate 101 includes components such as CMOS components, ASIC components, etc. disposed over or in the first substrate 101. In some embodiments, the first substrate 101 includes semiconductive materials such as silicon or other suitable materials. In some embodiments, the first substrate 101 is a silicon substrate or a silicon wafer. In some embodiments, the first substrate 101 is a CMOS substrate.

Figure 9B:
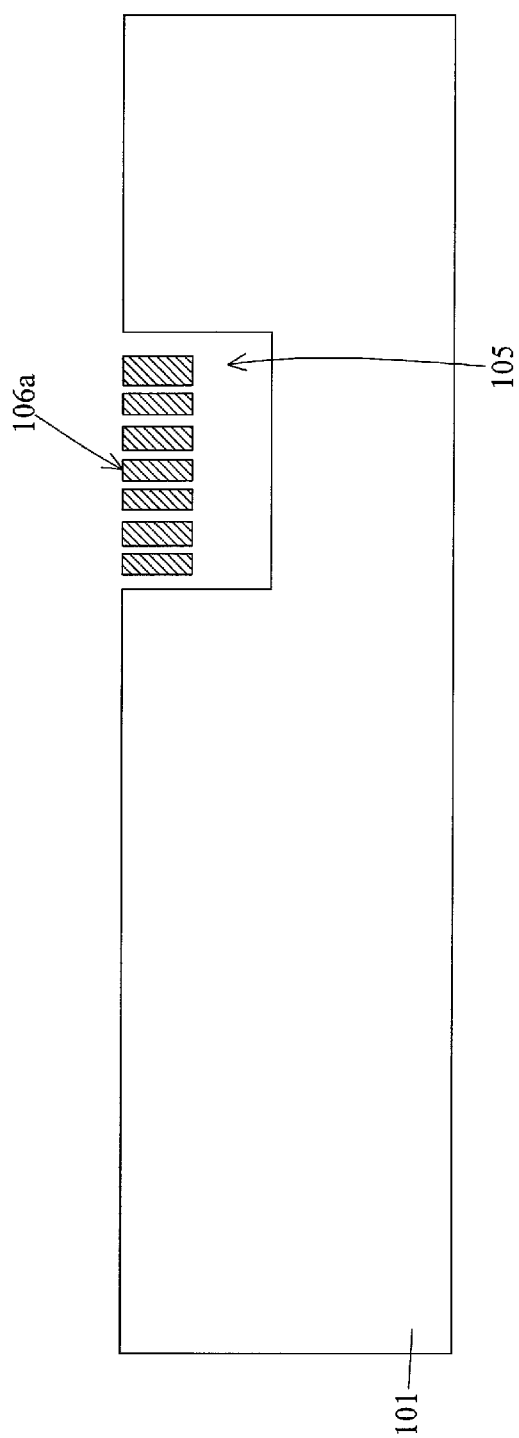

In operation 902, a first sensing structure 106a is disposed over the first substrate 101 as shown in FIG. 9B. In some embodiments, the first sensing structure 106a is configured for sensing a motion such as a motion sensing device. In some embodiments, the first sensing structure 106a is a gyroscope, an accelerometer, a one or more axes gyroscope, a one or more axes accelerometer or a one or more axes motion sensing device.

In operation 903, a second substrate 108 is disposed over the first substrate 101 and the first sensing structure 106a as shown in FIG. 9C. In some embodiments, the second substrate 108 is vertically stacked over the first substrate 101. In some embodiments, the second substrate 108 is a capping substrate or capping wafer for covering the first substrate 101. In some embodiments, the second substrate 108 includes silicon or other suitable materials. In some embodiments, the second substrate 108 is bonded over the first substrate 101 by eutectic bonding operations or other suitable operations. In some embodiments, a bond pad 108b is disposed over the second substrate 108. In some embodiments, the second substrate 108 is bonded over the first substrate 101 by the bond pad 108b through eutectic bonding operations under a high temperature of greater than about 300° C.

In some embodiments, a cavity 105 is formed by removing a portion of the first substrate 101 or the second substrate 108 by photolithography and etching operations or other suitable operations. The cavity 105 is disposed between the first substrate 101 and the second substrate 108. In some embodiments, the first sensing structure 106a is surrounded by and movable within the cavity 105.

In operation 904, a via 109 is formed as shown in FIG. 9D. In some embodiments, the via 109 extends through the second substrate 108. In some embodiments, the via 109 is formed by removing a portion of the second substrate 108 to form a recess 109b by photolithography and etching operations or other suitable operations, and filing a conductive material or semiconductive material within the recess 109b by deposition, electroplating or other suitable operations. In some embodiments, the recess 109b is filled by a metal such as copper to form the via 109 as a copper pillar. In some embodiments, the recess 109b is filled by a semiconductive material such as silicon, polysilicon, etc. to form the via 109 as a silicon pillar. In some embodiments, the via 109 is disposed over and electrically connected with the bond pad 108b. In some embodiments, a first isolation layer 109a is disposed over the second substrate 108 and a sidewall of the recess 109b after forming the recess 109b. In some embodiments, the first isolation layer 109a is disposed by CVD operations or other suitable operations. In some embodiments, the via 109 is surrounded by the first isolation layer 109a. In some embodiments, the first isolation layer 109a is disposed between the via 109 and the second substrate 108.

Figure 9E:
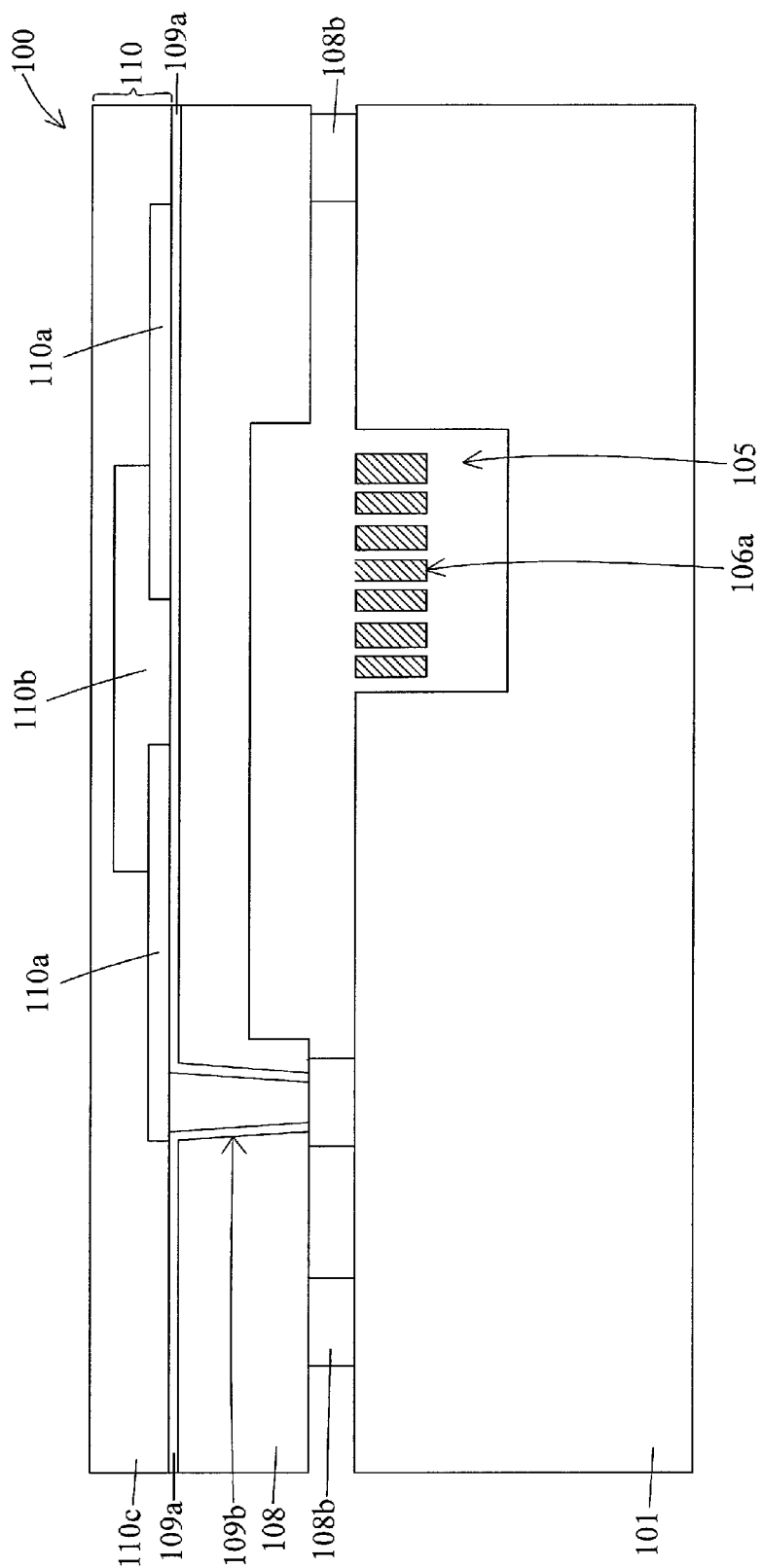

In operation 905, a second sensing structure 110 is formed over the second substrate 108 as shown in FIG. 9E. In some embodiments, the second sensing structure 110 is configured for sensing or detecting a magnetic field. In some embodiments, the second sensing structure 110 is a magnetic field sensor, magnetic sensor, one or more axes magnetic sensor, magnetometer, geomagnetic sensor, etc.

In some embodiments, an interconnect structure 110a is formed and disposed over the second substrate 108 and electrically connected with the via 109. In some embodiments, the interconnect structure 110a is patterned and formed over the first isolation layer 109a or the second substrate 108. In some embodiments, the interconnect structure 110a is formed by disposing a conductive material over the second substrate 108 and then patterning the conductive material to become the interconnect structure 110a. The conductive material is disposed by electroplating, sputtering, or other suitable operations. The conductive material is patterned by photolithography, etching or other suitable operations. In some embodiments, the interconnect structure 110a is electrically connected with the via 109.

In some embodiments, a sensing material 110b is formed and disposed over the second substrate 108. In some embodiments, the sensing material 110b at least partially covers the interconnect structure 110a. In some embodiments, the sensing material 110b is configured for sensing a magnetic field. In some embodiments, the sensing material 110b is a magnetic sensing material. In some embodiments, the sensing material 110b is disposed over the second substrate 108 and a portion of the interconnect structure 110a by deposition, photolithography, etching or other suitable operations.

In some embodiments, the second isolation layer 110c is disposed over the second substrate 108 and covers the interconnect structure 110a and the sensing material 110b. In some embodiments, the second isolation layer 110c is configured to protect the interconnect structure 110a and the sensing material 110b. In some embodiments, the second isolation layer 110c is formed by CVD or other suitable operations.

In some embodiments, the semiconductor structure 100 is formed as shown in FIG. 9E which has similar configuration as described above and illustrated in FIG. 1. The first substrate 101 and the second substrate 108 are vertically stacked over each other, and thus a geometric size or form factor of the semiconductor structure 100 is minimized. Further, as the second sensing structure 110 is formed after the bonding of the second substrate 108 over the first substrate 101 under a high temperature, the sensing material 110b which is easily deteriorated by heat or high temperature would not be affected or damaged during the bonding operations under high temperature.

Figure 10:
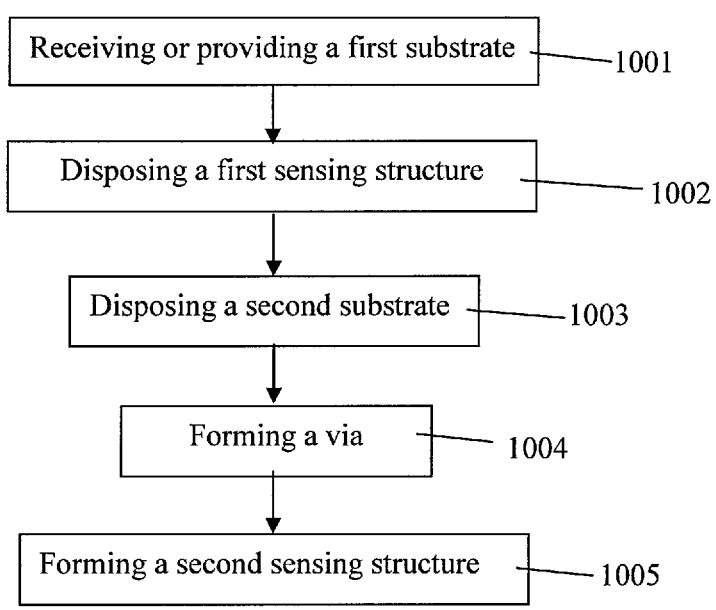
FIG. 10 is a flow diagram of a method of manufacturing a semiconductor structure in accordance with some embodiments of the present disclosure.
Figure 10A:
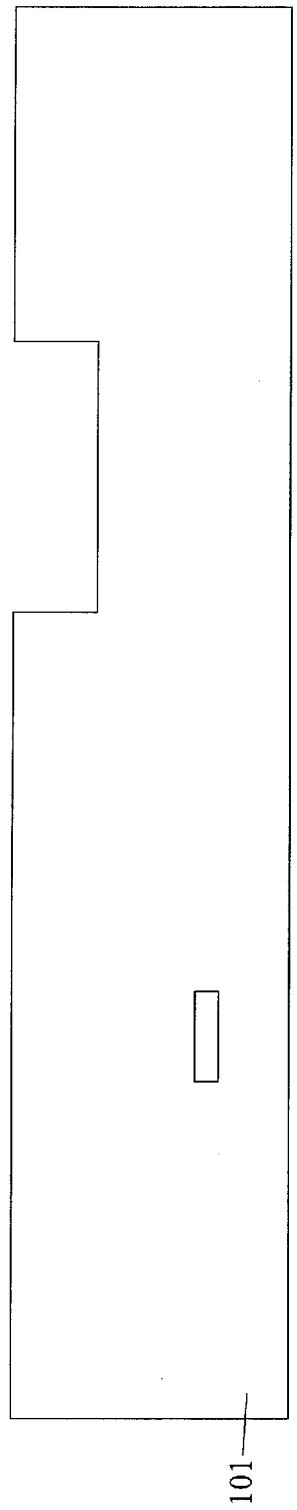

In some embodiments, a semiconductor structure 200' is formed by a method 1000. The method 1000 includes a number of operations and the description and illustration are not deemed as a limitation as the sequence of the operations. FIG. 10 is an embodiment of a method 1000 of manufacturing a semiconductor structure 200'. The method 1000 includes a number of operations (1001, 1002, 1003, 1004 and 1005).

Figure 10B:
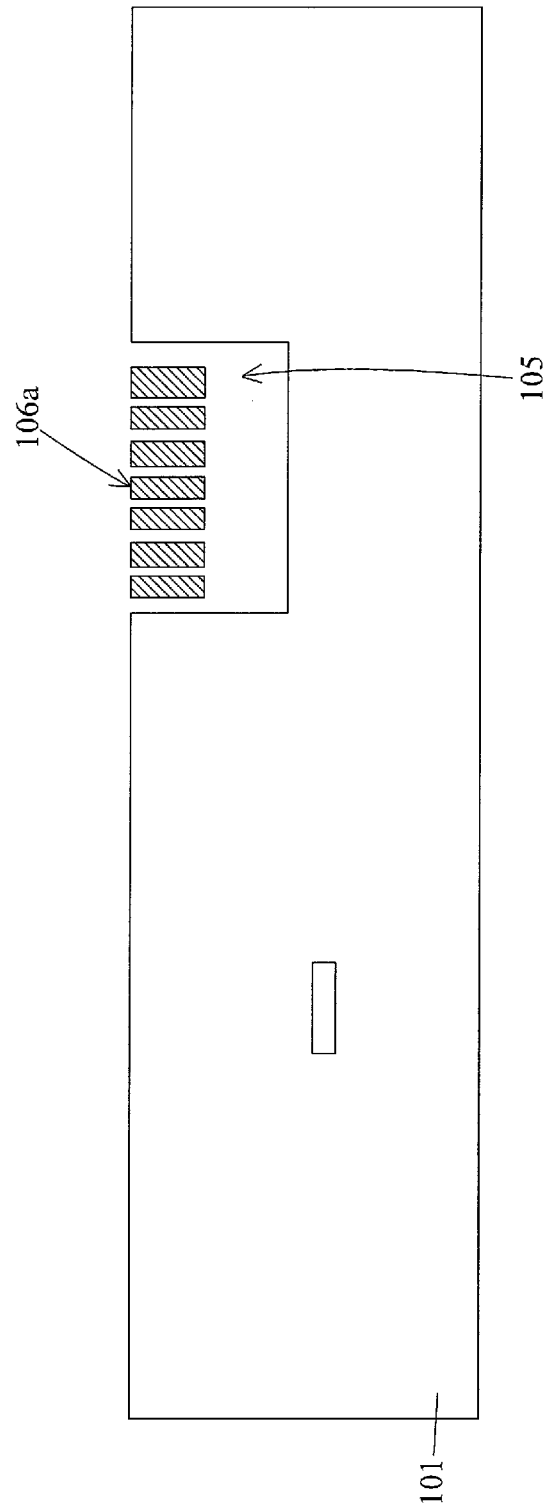

In operation 1001, a first substrate 101 is received or provided as shown in FIG. 9A. The operation 1001 is similar to the operation 901 in FIG. 9A. In operation 1002, a first sensing structure 106a is disposed over the first substrate 101 as shown in FIG. 10B. The operation 1002 is similar to the operation 902 in FIG. 9B. In operation 1003, a second substrate 108 is disposed as shown in FIG. 10C. The operation 1003 is similar to the operation 903 in FIG. 9C.

In operation 1004, a via 109 is formed as shown in FIG. 10D. In some embodiments, the via 109 extends through the first substrate 101. In some embodiments, the via 109 is formed by removing a portion of the first substrate 101 to form a recess 109b by photolithography and etching operations or other suitable operations, and filing a conductive material or semiconductive material within the recess 109b by deposition, electroplating or other suitable operations. In some embodiments, the recess 109b is filled by a metal such as copper to form the via 109 as a copper pillar. In some embodiments, the recess 109b is filled by a semiconductive material such as silicon, polysilicon, etc. to form the via 109 as a silicon pillar. In some embodiments, the via 109 is disposed over and electrically connected with a conductive structure in the first substrate 101. In some embodiments, a first isolation layer 109a is disposed over the first substrate 101 and a sidewall of the recess 109b. In some embodiments, the first isolation layer 109a is disposed by CVD operations or other suitable operations. In some embodiments, the via 109 is surrounded by the first isolation layer 109. In some embodiments, the first isolation layer 109 is disposed between the via 109 and the first substrate 101.

Figure 10E:
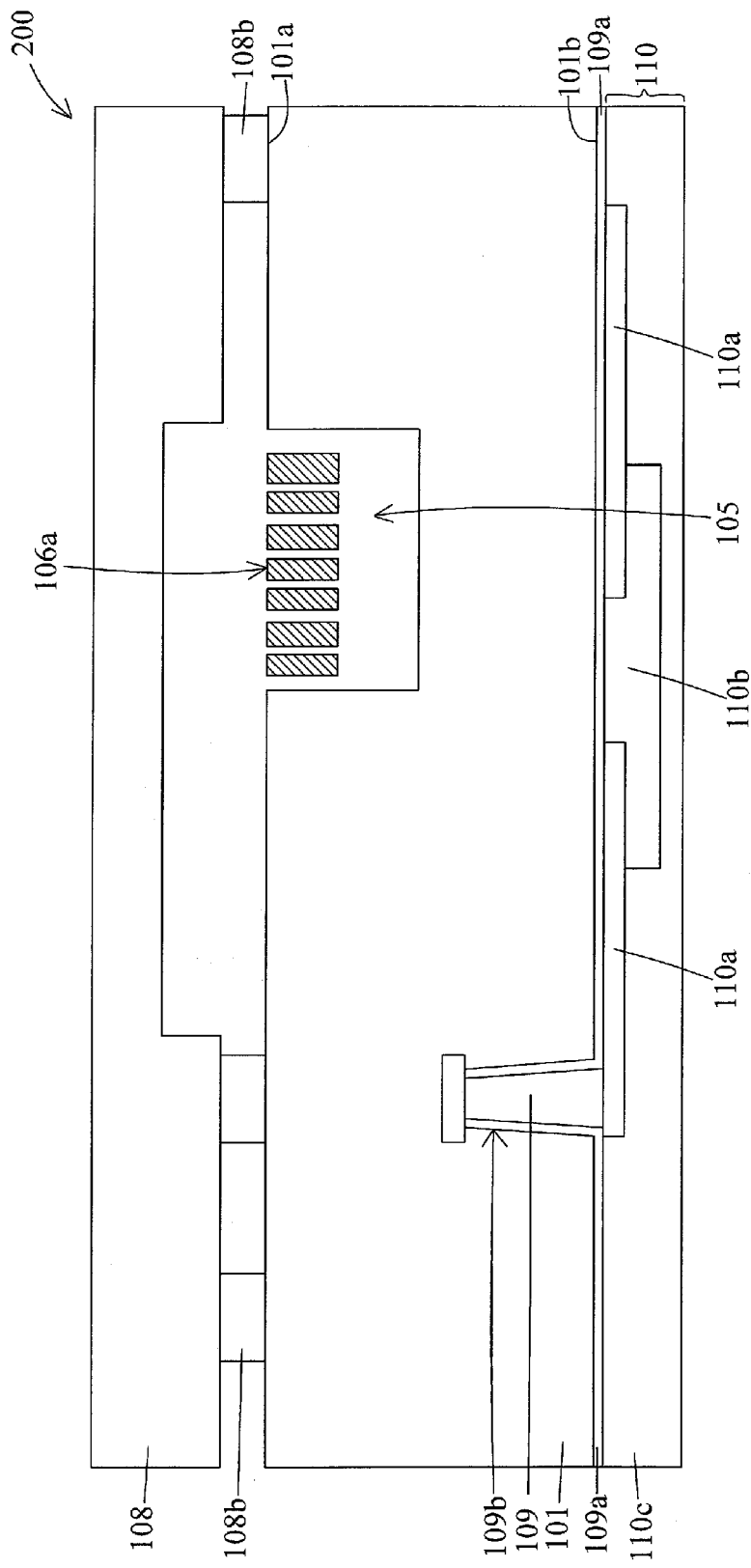

In operation 1005, a second sensing structure 110 is formed over the first substrate 101 as shown in FIG. 10E. In some embodiments, the second sensing structure 110 is configured for sensing or detecting a magnetic field. In some embodiments, the second sensing structure 110 is a magnetic field sensor, magnetic sensor, three or more axes magnetic sensor, magnetometer, geomagnetic sensor, etc. In some embodiments, an interconnect structure 110a is formed and disposed over the first substrate 101 and electrically connected with the via 109. In some embodiments, the interconnect structure 110a is patterned and formed over the first isolation layer 109a or the first substrate 101. In some embodiments, the interconnect structure 110a is formed by disposing a conductive material over the first substrate 101 and then patterning the conductive material to become the interconnect structure 110a. The conductive material is disposed by electroplating, sputtering, or other suitable operations. The conductive material is patterned by photolithography, etching or other suitable operations. In some embodiments, the interconnect structure 110a is electrically connected with the via 109.

In some embodiments, a sensing material 110b is formed and disposed over the first substrate 101. In some embodiments, the sensing material 110b at least partially covers the interconnect structure 110a. In some embodiments, the sensing material 110b is configured for sensing a magnetic field. In some embodiments, the sensing material 110b is a magnetic sensing material. In some embodiments, the sensing material 110b is disposed over the first substrate 101 and a portion of the interconnect structure 110a by deposition, photolithography, etching or other suitable operations.

In some embodiments, the second isolation layer 110c is disposed over the first substrate 101 and covers the interconnect structure 110a and the sensing material 110b. In some embodiments, the second isolation layer 110c is configured to protect the interconnect structure 110a and the sensing material 110b. In some embodiments, the second isolation layer 110c is formed by CVD or other suitable operations. In some embodiments, the semiconductor structure 200 is formed as shown in FIG. 10E which has similar configuration as described above and illustrated in FIG. 2.

The present disclosure is directed to a semiconductor structure including multiple devices that are integrated on a substrate. The semiconductive structure includes a substrate and one or more devices disposed over the substrate and integrated by several conductive vias. The integration of the devices by the conductive vias allows stacking of the devices over each other to reduce a geometric size of the semiconductor structure. Further, a magnetic sensing structure can be fabricated after completion of high temperature processes such as wafer bonding operations. As such, the magnetic sensing structure would not be damaged or affected by the high temperature.

In some embodiments, a semiconductor structure includes a first substrate, a second substrate, a first sensing structure over the first substrate, and between the first substrate and the second substrate, a via extending through the second substrate, and a second sensing structure over the second substrate, and including an interconnect structure electrically connected with the via, and a sensing material at least partially covering the interconnect structure.

In some embodiments, the via includes conductive material or semiconductive material. In some embodiments, the via electrically connects the interconnect structure with a bond pad disposed over the second substrate and opposite to the interconnect structure. In some embodiments, the semiconductor structure further includes a first bond pad over the first substrate and a second bond pad over the via and the second substrate, wherein the second substrate is bonded over the first substrate by eutectically bonding the first bond pad with the second bond pad. In some embodiments, the semiconductor structure further includes a first isolation layer over the second substrate and between the second substrate and the via. In some embodiments, the semiconductor structure further includes a second isolation layer over the second substrate and covering the interconnect structure and the sensing material. In some embodiments, the first sensing structure is movable within a cavity defined by the first substrate and the second substrate. In some embodiments, the first sensing structure is an accelerometer, a gyroscope, or a motion sensing device. In some embodiments, the sensing material is a magnetic sensing material for sensing a magnetic field, and the interconnect structure is a magnetic sensing electrode for transmitting an electrical signal according to the magnetic field sensed by the sensing material. In some embodiments, the sensing material includes anisotropic magnetoresistive (AMR) material, giant magnetoresistive (GMR) material or tunnel magnetoresistive (TMR) material. In some embodiments, the semiconductor structure further includes a UBM pad over a portion of the interconnect structure and electrically connected with the via, and a conductive bump over the UBM pad.

In some embodiments, a semiconductor structure includes a first substrate including a first surface and a second surface opposite to the first substrate, a second substrate over the first surface of the first substrate, a first sensing structure over the first surface of the first substrate, and between the first substrate and the second substrate, a via passing through the first substrate, and a second sensing structure over the second surface of the first substrate, and including an interconnect structure electrically connected with the via, and a sensing material at least partially covering the interconnect structure.

In some embodiments, the via is extended from the second surface of the first substrate to the first surface of the first substrate. In some embodiments, the semiconductor structure further includes a first isolation layer over the first substrate and between the first substrate and the via. In some embodiments, the semiconductor structure further includes a second isolation layer over the first substrate and covering the interconnect structure and the sensing material. In some embodiments, the semiconductor structure further includes a cavity between the first substrate and the second substrate, and surrounding the first sensing structure, wherein the cavity is in a vacuum or is at a gas pressure lower than about 1 atmospheric pressure (atm).

In some embodiments, a method of manufacturing a semiconductor structure includes receiving a first substrate, disposing a first sensing structure, disposing a second substrate over the first substrate and the first sensing structure, forming a via extending through the second substrate, forming a second sensing structure including an interconnect structure disposed over the second substrate and electrically connected with the via, and a sensing material at least partially covering the interconnect structure.

In some embodiments, the forming the via includes removing a portion of the second substrate to form a recess and filling the recess with a conductive material or semiconductive material. In some embodiments, the disposing the second substrate includes bonding the second substrate over the first substrate by eutectic bonding operations. In some embodiments, the method further includes disposing a first isolation layer over the second substrate and between the second substrate and the via, disposing a second isolation layer covering the interconnect structure and the sensing material, forming a cavity between the first substrate and the second substrate and surrounding the first sensing structure.

What is claimed is:

1. A semiconductor structure, comprising:
   a first substrate;
   a second substrate;
   a first sensing structure over the first substrate, and between the first substrate and the second substrate;
   a plug extending through the first substrate;
   a via extending through the second substrate;
   a bond pad disposed between the plug and the via and electrically connected the plug with the via;
   a first isolation layer disposed over the second substrate and surrounding the via;
   a second sensing structure over the first isolation layer, and including an interconnect structure electrically connected with the via, and a sensing material at least partially covering the interconnect structure; and
   a second isolation layer disposed over the first isolation layer and covering the second sensing structure,
   wherein the first isolation layer is disposed between the second substrate and the second isolation layer.

2. The semiconductor structure of claim 1, wherein the via includes conductive material or semiconductive material.

3. The semiconductor structure of claim 1, wherein the via is disposed over the plug.

4. The semiconductor structure of claim 1, wherein the bond pad includes a first bond pad over the plug and a second bond pad over the first bond pad, the first bond pad is bonded with the second bond pad.

5. The semiconductor structure of claim 1, wherein the first isolation layer is conformal to a surface of the second substrate and a sidewall of the via.

6. The semiconductor structure of claim 1, wherein the second isolation layer surrounds a conductive bump disposed over the second substrate.

7. The semiconductor structure of claim 1, wherein the first sensing structure is movable within a cavity defined by the first substrate and the second substrate.

8. The semiconductor structure of claim 1, wherein the first sensing structure is an accelerometer, a gyroscope, or a motion sensing device.

9. The semiconductor structure of claim 1, wherein the sensing material is a magnetic sensing material for sensing a magnetic field, and the interconnect structure is a magnetic sensing electrode for transmitting an electrical signal according to the magnetic field sensed by the sensing material.

10. The semiconductor structure of claim 1, wherein the sensing material includes anisotropic magnetoresistive (AMR) material, giant magnetoresistive (GMR) material or tunnel magnetoresistive (TMR) material.

11. The semiconductor structure of claim 1, further comprising a UBM pad over a portion of the interconnect structure and electrically connected with the via, and a conductive bump over the UBM pad.

12. A semiconductor structure, comprising:
    a first substrate including a first sensing structure and a plug extending through the first substrate;
    a second substrate including a first surface, a second surface opposite to the first surface and a via extending through the second substrate;
    a conductive structure disposed between the plug and the via and electrically connected the plug with the via;
    a first isolation layer disposed over the second surface of the second substrate and surrounding the via;
    a second sensing structure over the first isolation layer, and including an interconnect structure electrically connected with the via, and a sensing material at least partially covering the interconnect structure; and
    a second isolation layer disposed over the first isolation layer and covering the second sensing structure,
    wherein the plug is disposed over the via.

13. The semiconductor structure of claim 12, wherein the via is extended between the second surface of the second substrate and the first surface of the second substrate.

14. The semiconductor structure of claim 12, wherein the second isolation layer surrounds a conductive bump disposed over the second surface of the second substrate.

15. The semiconductor structure of claim 12, wherein the via includes silicon or polysilicon.

16. The semiconductor structure of claim 12, further comprising a cavity surrounding the first sensing structure, wherein the cavity is in a vacuum or is at a gas pressure lower than about 1 atmospheric pressure (atm).

17. A method of manufacturing a semiconductor structure:
    receiving a first substrate;
    disposing a first sensing structure over the first substrate;
    forming a plug extending through the first substrate;
    disposing a second substrate over the first substrate and the first sensing structure;
    forming a via extending through the second substrate;
    disposing a first isolation layer over the second substrate and surrounding the via;
    bonding the via with the plug by a bond pad disposed therebetween;
    forming a second sensing structure including an interconnect structure disposed over the second substrate and electrically connected with the via, and a sensing material at least partially covering the interconnect structure; and
    disposing a second isolation layer over the first isolation layer and covering the second sensing structure.

18. The method of claim 17, wherein the forming the via includes removing a portion of the second substrate to form a recess and filling the recess with a conductive material or semiconductive material.

19. The method of claim 17, wherein the bonding the via with the plug includes eutectic bonding operations.

20. The method of claim 17, further comprising:
    disposing a conductive bump over the second substrate and surrounded by the second isolation layer; or
    forming a cavity disposed between the first substrate and the second substrate and surrounding the first sensing structure.

* * * * *